United States Patent
Mitsugi et al.

(10) Patent No.: US 9,472,712 B2
(45) Date of Patent: Oct. 18, 2016

(54) SEMICONDUCTOR LIGHT EMITTING DEVICE

(71) Applicant: Kabushiki Kaisha Toshiba, Minato-ku, Tokyo (JP)

(72) Inventors: Satoshi Mitsugi, Kawasaki Kanagawa (JP); Hiroshi Katsuno, Kamatsu Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/845,201

(22) Filed: Sep. 3, 2015

(65) Prior Publication Data

US 2016/0211408 A1   Jul. 21, 2016

(30) Foreign Application Priority Data

Jan. 16, 2015   (JP) .................. 2015-006946

(51) Int. Cl.

| H01L 33/00 | (2010.01) |
|---|---|
| H01L 33/14 | (2010.01) |
| H01L 33/38 | (2010.01) |
| H01L 33/62 | (2010.01) |

(52) U.S. Cl.
CPC ......... *H01L 33/0008* (2013.01); *H01L 33/145* (2013.01); *H01L 33/38* (2013.01); *H01L 33/62* (2013.01)

(58) Field of Classification Search
None
See application file for complete search history.

(56) References Cited

U.S. PATENT DOCUMENTS

| 6,278,136 B1 * | 8/2001 | Nitta ...................... H01L 33/32 257/103 |
|---|---|---|
| 8,461,615 B2 | 6/2013 | Kimura et al. |
| 8,816,382 B2 | 8/2014 | Liang et al. |
| 2005/0224823 A1 * | 10/2005 | Zhao ................... H01L 33/38 257/91 |
| 2007/0114636 A1 | 5/2007 | Erchak et al. |
| 2009/0230545 A1 | 9/2009 | Erchak et al. |
| 2009/0315054 A1 * | 12/2009 | Kim ..................... H01L 33/20 257/98 |
| 2011/0215363 A1 * | 9/2011 | Kimura ................ H01L 33/36 257/99 |
| 2012/0018765 A1 * | 1/2012 | Mizogami ........... H01L 33/42 257/99 |
| 2013/0146934 A1 * | 6/2013 | Lin ...................... H01L 33/38 257/99 |

(Continued)

FOREIGN PATENT DOCUMENTS

| CN | 103700744 A | 4/2014 |
|---|---|---|
| EP | 2525420 A2 | 11/2012 |

(Continued)

OTHER PUBLICATIONS

Extended European Search Report issued on Mar. 8, 2016 in counterpart European Patent application No. 15183865.3.

*Primary Examiner* — Kien Ly

(74) *Attorney, Agent, or Firm* — White & Case LLP

(57) ABSTRACT

According to one embodiment, a semiconductor light emitting device includes a semiconductor layer, an electrode pad, a first electrode, a second electrode and a layer. The semiconductor layer includes a first semiconductor layer, a second semiconductor layer, and a light emitting layer. The electrode pad is provided in adjacent to the semiconductor layer. The first electrode is connected to the electrode pad with one end, extends from the electrode pad, and is connected to the first semiconductor layer. The second electrode is connected to the second semiconductor layer. The layer with lower conductivity is provided between part of the first semiconductor layer and part of the first electrode. The first electrode has an electrode width. The electrode width is in a direction perpendicular to a direction in which the first electrode extends. The electrode width decreases with distance from the electrode pad.

12 Claims, 18 Drawing Sheets

(56) References Cited

U.S. PATENT DOCUMENTS

2013/0153951 A1    6/2013    Nihei et al.
2013/0248921 A1    9/2013    Kimura et al.

FOREIGN PATENT DOCUMENTS

JP      06-005921 A     1/1994
JP      2013-055186 A     3/2013

* cited by examiner

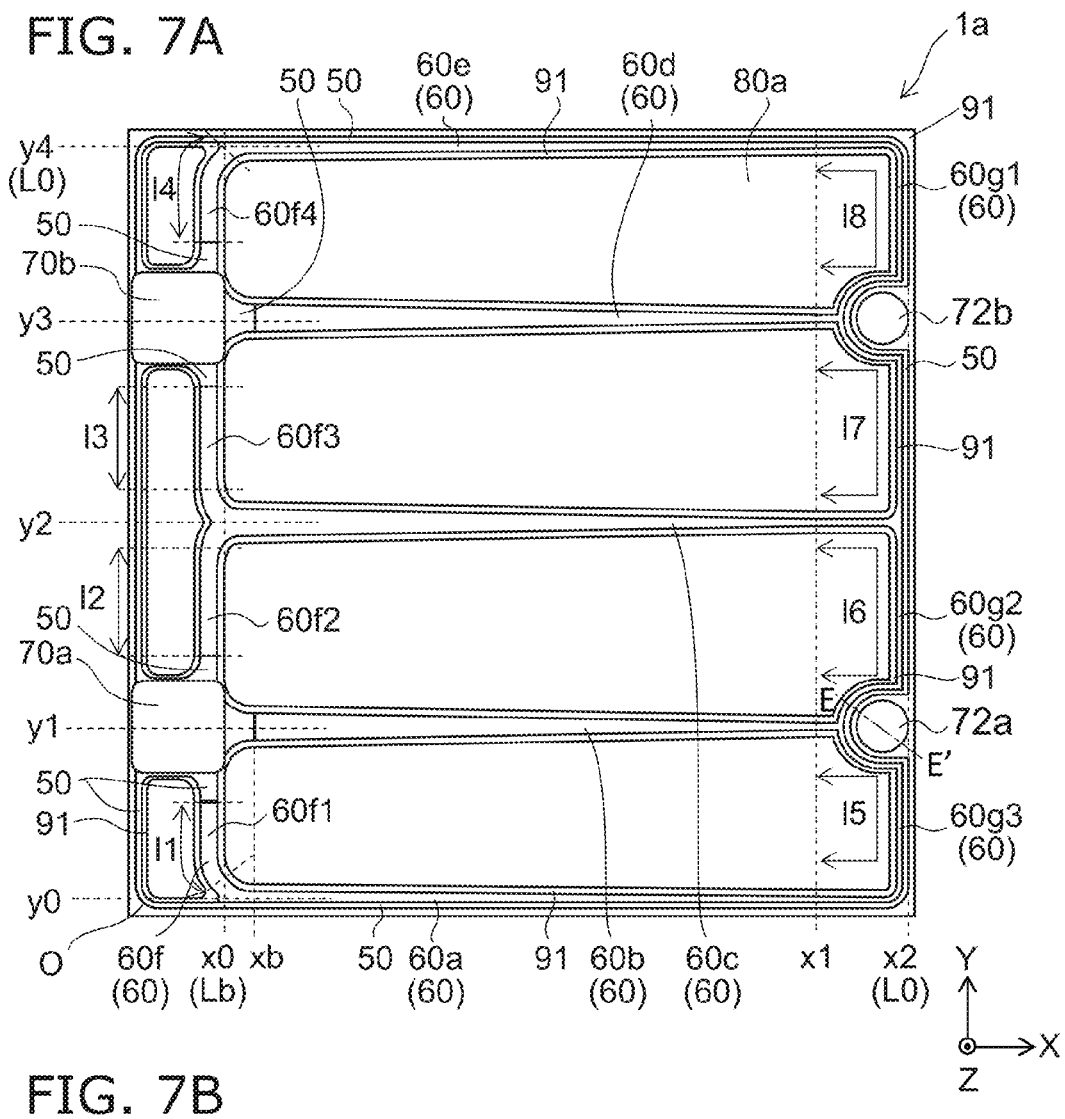
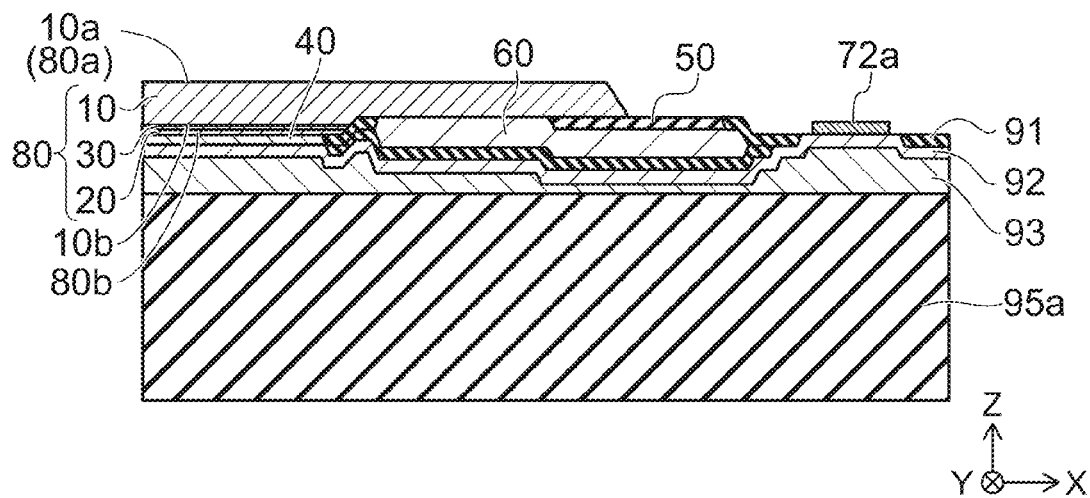

SEMICONDUCTOR LIGHT EMITTING DEVICE

CROSS-REFERENCE TO RELATED APPLICATIONS

This application is based upon and claims the benefit of priority from Japanese Patent Application No. 2015-006946, filed on Jan. 16, 2015; the entire contents of which are incorporated herein by reference.

FIELD

Embodiments described herein relate to a semiconductor light emitting device.

BACKGROUND

A semiconductor light emitting device, such as an LED (light emitting diode), includes a semiconductor layer having a light emitting layer, a p electrode, and an n electrode. In the semiconductor light emitting device, the p electrode is formed on one surface of the semiconductor layer and the n electrode is formed on the other surface of the semiconductor layer, or the p and n electrodes are formed on one surface of the semiconductor layer. In the thus configured semiconductor light emitting device, it is desired to improve the light emission efficiency.

BRIEF DESCRIPTION OF THE DRAWINGS

FIG. 7A is a perspective plan view illustrating a semiconductor light emitting device according to Variation 1 of the first embodiment;
FIG. 7B is a cross-sectional view taken along the line E-E' in FIG. 7A.

DETAILED DESCRIPTION

Figure 1A:
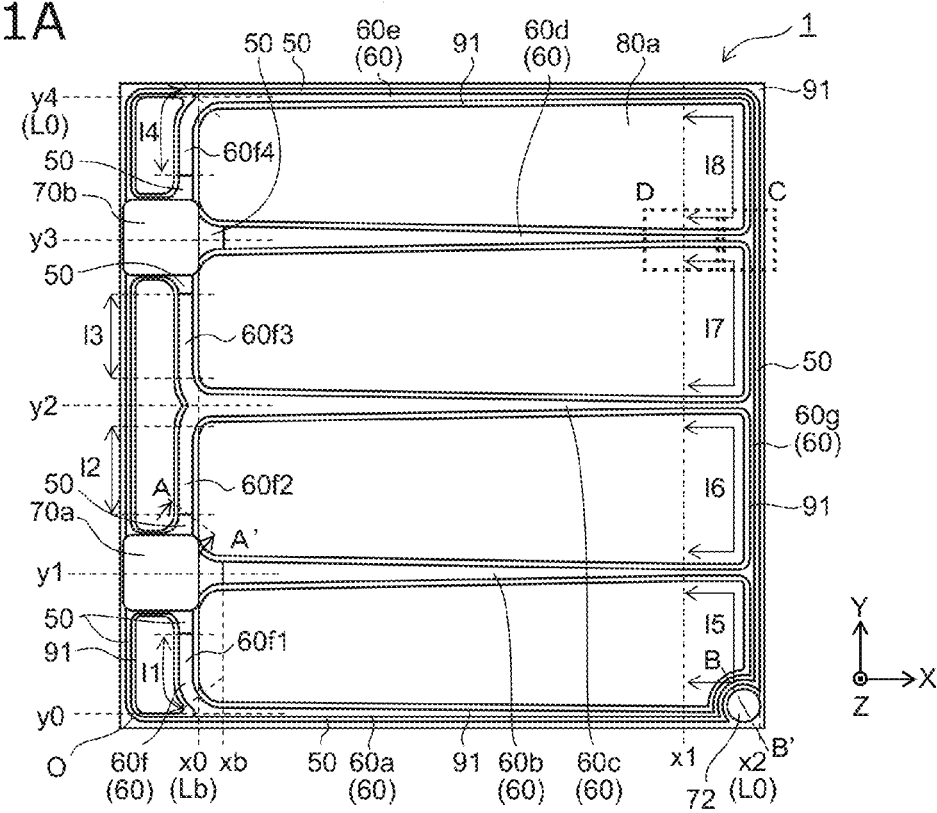
FIG. 1A is a perspective plan view illustrating a semiconductor light emitting device according to a first embodiment.

According to an embodiment, a semiconductor light emitting device includes a semiconductor layer, an electrode pad, a first electrode, a second electrode and a layer. The semiconductor layer includes a first semiconductor layer of a first conductivity type, a second semiconductor layer of a second conductivity type, and a light emitting layer between the first semiconductor layer and the second semiconductor layer. The electrode pad is provided in adjacent to the semiconductor layer. The first electrode is connected to the electrode pad with one end, extends from the electrode pad, and is connected on one surface of the first semiconductor layer. The second electrode is connected to the second semiconductor layer. The layer is provided between part of the first semiconductor layer and part of the first electrode and has conductivity less than conductivity of the first electrode. The first electrode has an electrode width. The electrode width is a length along a surface that the first electrode connects to the first semiconductor layer. The length is in a direction perpendicular to a direction in which the first electrode extends. The electrode width decreases with distance from the electrode pad.

Embodiments of the invention will be described below with reference to the drawings.

The drawings are schematically and conceptually drawn, and the relationship between the thickness and the width of each portion, the size ratio between portions, and other factors are therefore not necessarily equal to actual ones. Further, when the same portion is drawn in two or more figures, dimensions and ratios in a figure may differ from those in another figure.

In the specification and drawings, the same element as that having been described with reference to a figure having been referred to has the same reference character and will not be described in detail as appropriate.

First Embodiment

Figure 1B:
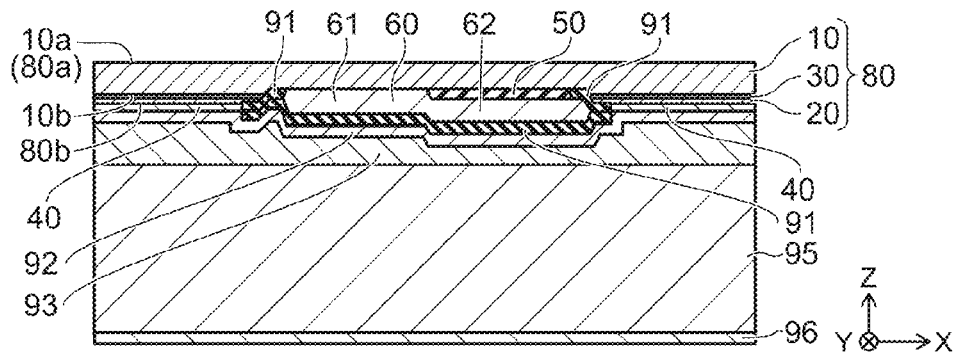
FIG. 1B is a cross-sectional view taken along the line A-A' in FIG. 1A.
Figure 1C:
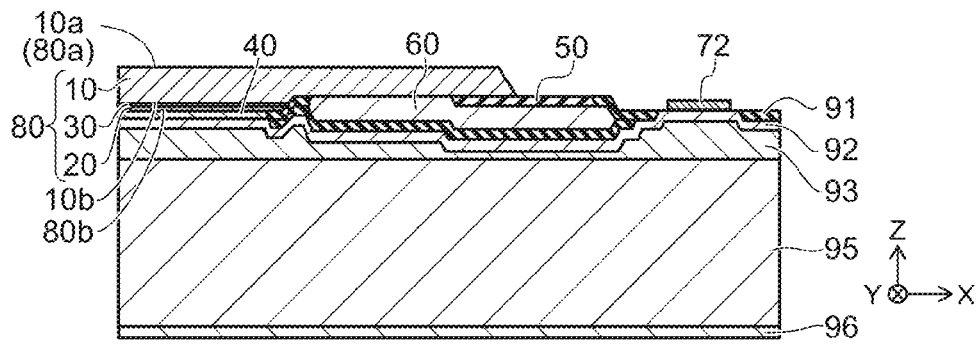
FIG. 1C is a cross-sectional view taken along the line B-B' in FIG. 1A.

FIG. 1A is a perspective plan view illustrating a semiconductor light emitting device according to a first embodiment. FIG. 1B is a cross-sectional view taken along the line A-A' in FIG. 1A. FIG. 1C is a cross-sectional view taken along the line B-B' in FIG. 1A.

Figure 2:
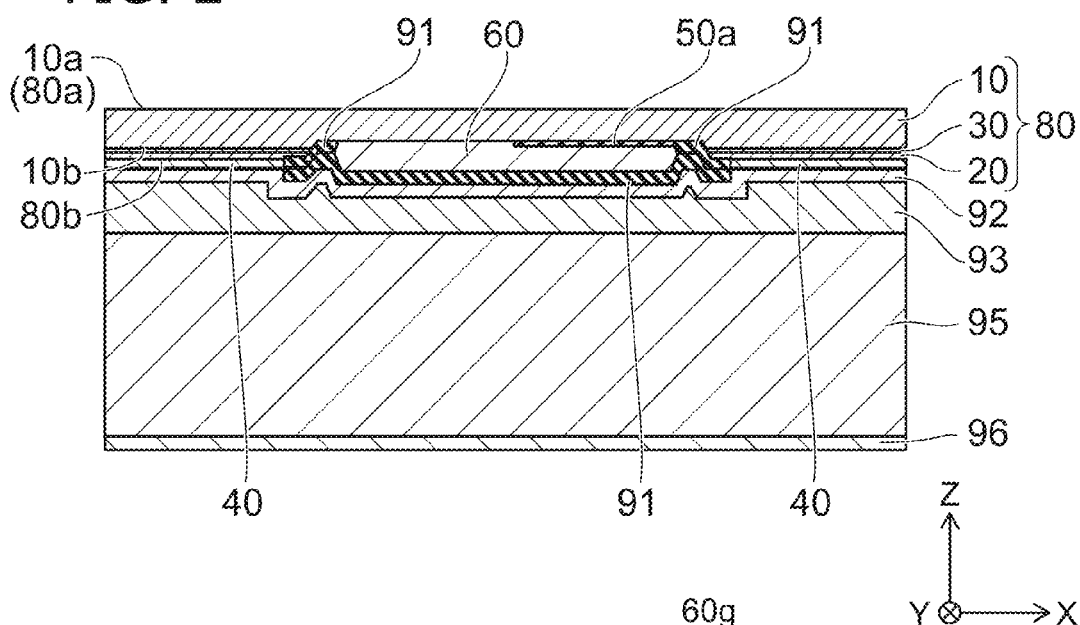
FIG. 2 is a cross-sectional view of another example of the semiconductor light emitting device according to the embodiment.

FIG. 2 is a cross-sectional view of another example of the semiconductor light emitting device according to the embodiment.

Figure 3A:
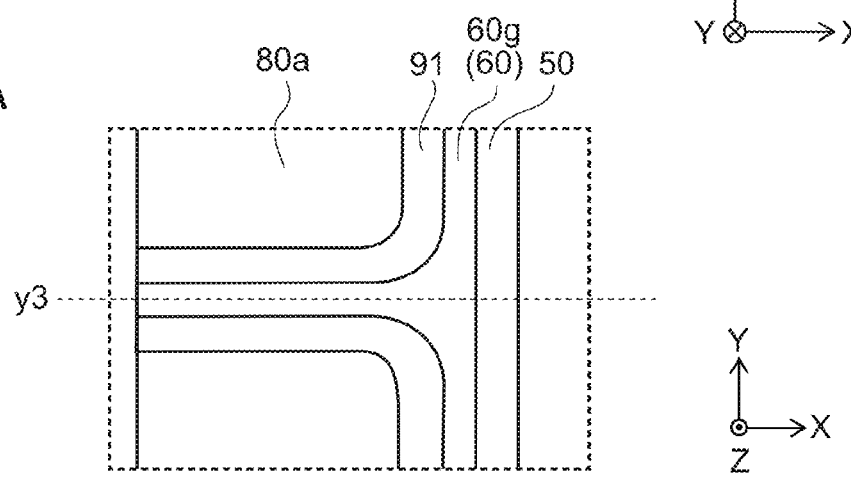
FIG. 3A is an enlarged view of a portion C in FIG. 1A.
Figure 3B:
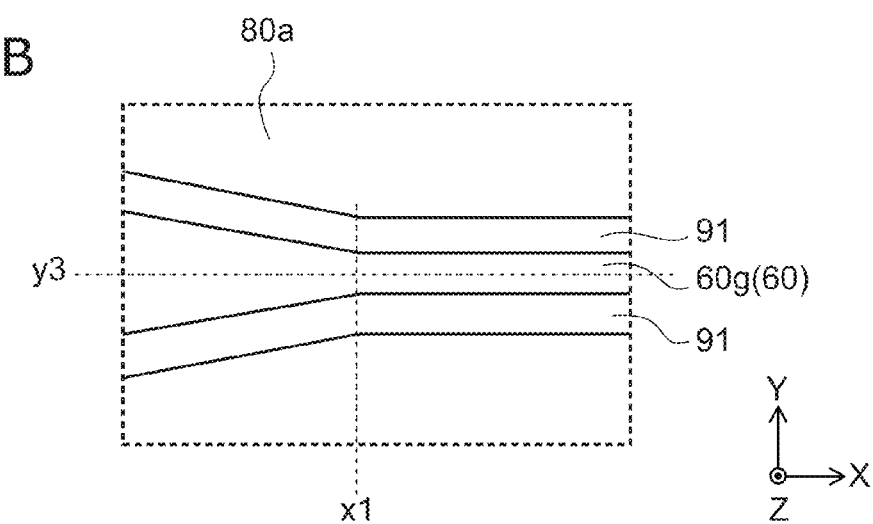
FIG. 3B is an enlarged view of a portion D in FIG. 1A.

FIG. 3A is an enlarged view of a portion C in FIG. 1A. FIG. 3B is an enlarged view of a portion D in FIG. 1A.

Figure 4A:
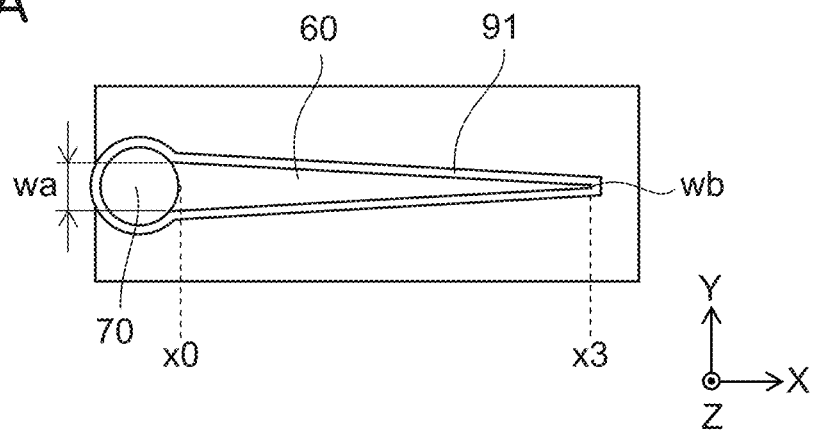
FIG. 4A is a plan view showing example of part of the semiconductor device according to the embodiment.
Figure 4B:
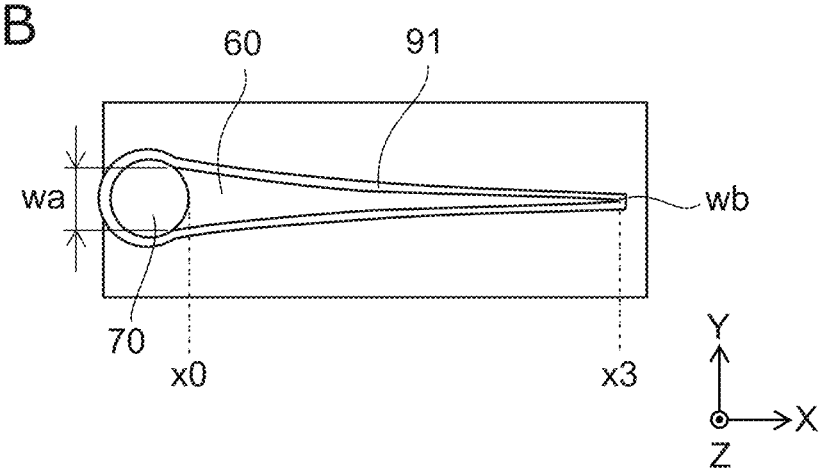
FIG. 4B is a plan view showing example of part of the semiconductor device according to the embodiment.
Figure 4C:
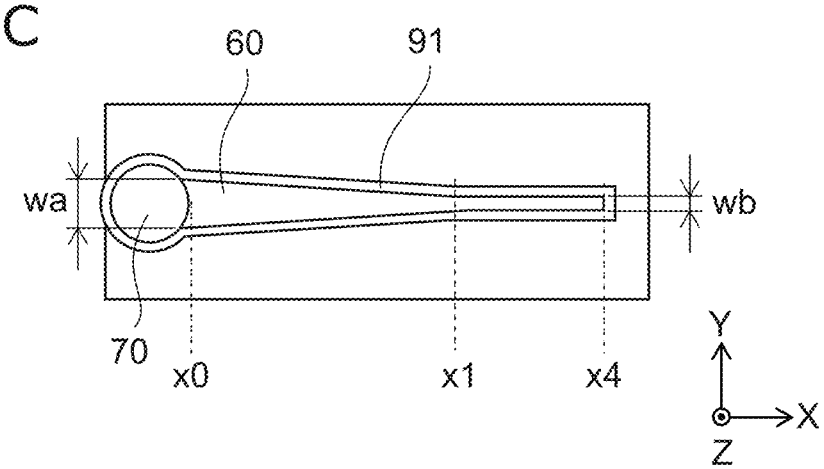
FIG. 4C is a plan view showing example of part of the semiconductor device according to the embodiment.

FIGS. 4A to 4C are plan views showing examples of part of the semiconductor device according to the embodiment.

A semiconductor light emitting device 1 according to the first embodiment includes a first semiconductor layer 10, a second semiconductor layer 20, a light emitting layer 30, a first electrode 60, a second electrode 40, a current block layer 50, and electrode pads 70a and 70b, as shown in FIGS. 1A to 1C. The semiconductor light emitting device 1 further includes an insulating layer 91, a back metal 92, a support layer 93, a support substrate 95, and a backside contact 96. The second semiconductor layer 20, the light emitting layer 30, and the first semiconductor layer 10 are stacked in this order to form a semiconductor layer 80. The semiconductor layer 80 has a surface 80a, which faces the first semiconductor layer 10, and a surface 80b, which faces the second semiconductor layer 20.

In the following description, it is assumed that the direction from the second electrode 40 toward the first electrode 60 is the positive direction of a Z axis, and that one direction perpendicular to the Z-axis-direction is an X-axis-direction. It is further assumed that the direction perpendicular to the X-axis-direction and the Z-axis-direction is a Y-axis-direction. The direction from the first semiconductor layer 10 toward the second semiconductor layer 20 is the negative direction of the Z axis. In the following description, the direction parallel to the Z-axis-direction and the Y-axis-direction is called a horizontal direction and the direction parallel to the Z-axis-direction is called a vertical direction in some cases from the viewpoint of the drawings.

The first semiconductor layer 10 has a surface 10a (first surface) and a surface 10b (second surface) facing away from the surface 10a. The surface 10a is the surface 80a of the semiconductor layer 80. The first semiconductor layer 10 is a layer made of an n-type (first conductivity) semiconductor, for example, the semiconductor into which an n-type semiconductor forming impurity has been introduced. The n-type semiconductor layer is, for example, a GaN layer. The second semiconductor layer 20 is provided on the side facing the surface 10b of the first semiconductor layer 10. The second semiconductor layer 20 is a layer made of a p-type (second conductivity) semiconductor, for example, the semiconductor into which a p-type semiconductor forming impurity has been introduced. The p-type semiconductor layer is, for example, a p-type GaN layer. The light emitting layer 30 is provided on the side facing the surface 10b of the first semiconductor layer 10. The light emitting layer 30 has, for example, a multiple quantum well structure. The semiconductor layer 80 has a thickness in the Z-direction ranging, for example, from approximately 1 to 4 μm. The following description will be made by assuming that the first semiconductor layer 10 is an n-type semiconductor layer and the second semiconductor layer 20 is a p-type semiconductor layer.

The material of each of the semiconductor layers is not limited to the specific example described above and can, for example, be any of a variety of GaN-based nitride semiconductors and other III-V group compound semiconductors and any of a variety of other compound semiconductors.

The first electrode 60 is in contact with and electrically connected to the first semiconductor layer 10 on side thereof where the light emitting layer 30 is provided, that is, on the side where the surface 10b is present. The insulating layer 91 is provided not only on the surface of the first electrode 60 that faces away from the surface thereof connected to the first semiconductor layer 10 but also on the side surface of the first electrode 60. The first electrode 60 is therefore electrically insulated from the second semiconductor layer 20 and the light emitting layer 30. The first electrode 60 is made of a highly conductive material, for example, a metal or an alloy containing Al, Si-containing Al, or any other substance. In a case where the current block layer 50, which will be described later, is formed, a portion of the first electrode 60 that is connected to the surface 10b of the first semiconductor layer 10 is called a first portion 61. A portion of the first electrode 60 where the current block layer 50 is formed between the first semiconductor layer 10 and the first electrode 60 in the Z-axis-direction is called a second portion 62. The first portion 61 and the second portion 62 of the first electrode 60 are so configured that the second portion 62 is shifted in the negative direction of the Z axis, and a step is produced between the first portion 61 and the second portion 62, as shown in FIG. 1B.

The second electrode 40 is provided between the second semiconductor layer 20 and the support substrate 95 in the Z-axis-direction. The second electrode 40 is in contact with and electrically connected to the second semiconductor layer 20 on the side facing the surface 80b of the semiconductor layer 80. The insulating layer 91 is provided on a side surface of the second electrode 40, that is, the side surface adjacent to the first electrode 60. The second electrode 40 is made of a highly conductive material, for example, a metal or an alloy containing Ag or any other substance.

The support substrate 95 has conductivity and is, for example, a semiconductor substrate made, for example, of Si or a metal substrate made, for example, of Cu or CuW. The support substrate 95 supports the structure thereabove, such as the semiconductor layer 80, the first electrode 60, and the second electrode 40, and allows the semiconductor light emitting device 1 to be stably connected to a structural object, such as a package.

The back metal 92 is provided between the second electrode 40 and the support substrate 95, and the back metal 92 is in contact with the surface of the second electrode 40 on the side facing away from the surface 80b of the second semiconductor layer 20. The back metal 92 is also provided below the first electrode 60 in the Z direction via the insulating layer 91. The back metal 92 suppresses to diffuse metal atoms configured the second electrode 40. The back metal 92 supports to uniformly distribute a current in the second electrode 40. The back metal 92 reflects light produced by and emitted from the semiconductor layer 80 in the direction away from the support substrate 95 for improvement in light emission efficiency.

Further, the support layer 93 is provided between the back metal 92 and the support substrate 95, and the support layer 93 absorbs irregularities of the back metal 92 in the Z-direction to achieve ohmic junction and connects the back metal 92 to the support substrate 95. The support layer 93 is formed, for example, of a solder buried layer or a bonded layer.

The backside contact 96 is provided on the surface of the support substrate 95 on the side facing away from the side where the second electrode 40 is provided. The backside contact 96 is made, for example, of Ti/Pt/Au, which achieves ohmic junction between the backside contact 96 and the support substrate 95.

Current flowing through the second semiconductor layer 20 flows through the second electrode 40, the back metal 92, the support layer 93, the support substrate 95, and the backside contact 96. That is, current flowing through the semiconductor light emitting device 1 flows in the horizontal direction between the first electrode 60 and the second electrode 40 and flows in the vertical direction between the second electrode 40 and the backside contact 96.

To measure electrical properties of the semiconductor light emitting device 1 in a wafer state before scribing and dicing, the semiconductor light emitting device 1 may be provided with an electrode pad 72 for the second electrode, and the electrode pad 72 may be disposed on the surface where the electrode pads 70a and 70b are present. The electrode pad 72 is positioned at a corner of the semiconductor chip not to lower the light emission efficiency of the semiconductor light emitting device 1, as shown in FIG. 1A. The electrode pad 72 for the second electrode 40 is electrically connected to the second electrode 40 via the back metal 92, which is so formed that it extends between the second electrode 40 and the electrode pad 72, as shown in FIG. 1C. The position and area of the electrode pad 72 are not limited to those described above and can be arbitrarily set, and the number of electrode pads 72 is not limited to one and may be two or more. The electrode pad 72 does not necessarily have a circular shape and may, for example, have an elliptical shape, a rectangular shape, a triangular shape, or a polygonal shape.

The current block layer 50 is provided between the first semiconductor layer 10 and the first electrode 60 in the Z-axis-direction. The current block layer 50 is an insulating layer having conductivity sufficiently less than that of the first electrode and is made of an insulating material or formed of a layer configured to have high resistance. The insulating material is, for example, a dielectric material containing a silicon oxide ($SiO_2$), a silicon nitride ($Si_3N_4$), a silicon oxynitride (SiON), a lithium fluoride (LiF), an aluminum oxide ($Al_2O_3$), an aluminum nitride (AlN), a gallium nitride (GaN), a hafnium oxide ($HfO_2$), a zirconium dioxide ($ZrO_2$), a titanium oxide ($TiO_2$), any other oxide, nitride, or fluoride, or a mixture thereof. In the semiconductor light emitting device 1, providing the current block layer 50 in a location where current concentration tends to occur, such as a location where the first electrode 60 is connected to the electrode pads 70a and 70b, causes electrons and other carriers (hereinafter referred to as electrons and the like) to flow but detour around the current block layer 50 for dispersion of the direction in which the electrons and the like flow, whereby an increase in wiring resistance and hence current concentration are suppressed. As a result, a semiconductor light emitting device that has a highly uniform current distribution and hence achieves highly uniform light emission is provided. The dielectric described above that forms the current block layer 50 is optically highly transparent from a viewpoint of light emission efficiency and has a refractive index equal to or less than that of the semiconductor layer 80. The current block layer 50 desirably has a lowest possible refractive index, and the average refractive index may be lowered by forming a bubbly or spongy current block layer 50. The current block layer 50, which has a function as a total internal reflection (TIR) mirror, suppresses optical loss due to the first electrode 60. The thickness of the current block layer 50 in the Z-axis-direction is desirably equal to or greater than $\lambda/2n$, but when optical absorbance of the dielectric is not negligible, or when the TIR effect is not expected, the thickness is desirably not less than 1 nm but not more than $\lambda/8n$. When the thickness is 1 nm or smaller, tunnel current is significant in some dielectrics in some cases. Thicknesses ranging from $\lambda/8n$ to $\lambda/2n$ are not desirable because optical absorbance of the first electrode 60 increases. In the above description, $\lambda$ represents the wavelength of light, and n represents the refractive index of the dielectric at the wavelength $\lambda$.

A material containing a noncontact metal desirably has high optical reflectance. The material containing a noncontact metal having a small thickness of approximately 0.5 nm satisfactorily functions depending on the composition of the material.

To form a current block layer 50a with a layer configured to have high resistance, the formation can be achieved by causing part of the first semiconductor layer 10 at the junction between the first electrode 60 and the first semiconductor layer 10 to undergo a plasma process, a radical process, an ion process, or any other process in advance for inactivation of the part of the first semiconductor layer 10 so that the first electrode 60 does not come into contact with the first semiconductor layer 10, as shown in FIG. 2. In this case, the current block layer 50a can be sufficiently thinner than the first electrode 60.

The current block layer 50 is provided partially along the first electrode 60 and disperses electrons and the like flowing through the first electrode 60 to suppress current concentration. The current block layer 50 further causes the step between the first portion 61 and the second portion 62 to be formed in the first electrode 60. The step creates another electron current having a momentum vector having a component different from a component in the direction in which the electrons and the like flow through the first electrode 60, that is, the direction of the momentum vector of the electrons for suppression of progress of electromigration. The current block layer 50 further prevents light produced by and emitted from the semiconductor layer 80 from being absorbed by the first electrode 60 for contribution to improvement in light emission efficiency.

The insulating layer 91 is provided between the back metal 92 and the first electrode 60 and electrically insulates the first electrode 60 from the second electrode 40. The insulating layer 91 may be made of the same material as that of the current block layer 50.

Each of the electrode pads 70a and 70b has a substantially rectangular shape and is provided in the vicinity of an end of the semiconductor layer 80. The electrode pads 70a and 70b are electrically connected to the first electrode 60. A bonding wire or any other wire is bonded to each of the electrode pads 70a and 70b to electrically connect the first electrode 60 to an external circuit. In this example, the two electrode pads are provided, but the number of electrode pads is not limited to two and may be one or three or more. It is, however, noted that a large number of electrode pads increases the chip size and therefore lowers the light emission efficiency in some cases. Further, the electrode pads do not necessarily have the rectangular shape described above and can have an arbitrary shape. For example, the shape may be an oblong shape, a triangular shape, or any other polygonal shape, a circular shape, an elliptical shape, or any other shape.

The semiconductor light emitting device 1 is a light emitting diode (LED) made of a semiconductor, such as a GaN-based nitride semiconductor. The semiconductor light emitting device 1 has a thin-film structure. A semiconductor light emitting device having a thin-film structure has a structure in which a semiconductor layer grown on a growth substrate is transferred onto the support substrate 95 different from the growth substrate. In the semiconductor light emitting device 1, since both the first electrode 60 and the second electrode 40 are provided on the side facing the second surface 10b of the first semiconductor layer 10 and current conducts between the first electrode 60 and the second electrode 40 and flows laterally, the horizontally conducting thin-film structure in the following semiconductor light emitting device 1 is called an LTF (lateral thin-film) structure in some cases.

The first electrode 60 provided in the semiconductor light emitting device 1 has a thin line electrode structure having line-shaped portions in an XY plan view. The second electrode 40 may instead have line-shaped portions. That is, one of the first electrode 60 and the second electrode 40 is assumed to have line-shaped portions. Each of the electrodes may have a frame shape, a comb shape, a grid shape, a zigzag shape, or a combination thereof.

The semiconductor light emitting device 1 according to the embodiment is formed as a semiconductor chip having a square shape each side of which has a length L0. The semiconductor light emitting device 1 has a chip area L0×L0. In the following description, it is assumed that the semiconductor light emitting device 1 has a plane parallel to the XY plane, and that one of the four corners of the device coincides with an origin O. That is, the semiconductor light emitting device 1 is a semiconductor chip having a side extending from the origin O in the positive X-axis-direction and having the length L0, a side facing the side described above and having the length L0, a side extending from the origin O in the positive Y-axis-direction and having the length L0, and a side facing the side described above and having the length L0.

The two electrode pads 70a and 70b of the semiconductor light emitting device 1 according to the embodiment have the same shape and area and each have a substantially square shape each side of which has a length Lp. The electrode pads 70a and 70b are disposed in an end portion of the XY plane on the side where the origin O is present. In the Y-axis-direction, the center of the electrode pad 70a, which is one of the two electrode pads, is located in a position y1, and the center of the electrode pad 70b, which is the other electrode pad, is located in a position y3. The sides of the electrode pads 70a and 70b that extend along the Y axis and face away from the sides extending from the origin O are located in a position x0.

The first electrode 60 of the semiconductor light emitting device 1 has line-shaped portions parallel to the XY plane. The line-shaped portions of the first electrode 60 that extend in the X-direction are called horizontal lines and the line-shaped portions of the first electrode 60 that extend in the Y-direction are called vertical lines for convenience in some cases. The semiconductor light emitting device 1 according to the embodiment has first electrodes 60a to 60e formed of five horizontal lines and first electrodes 60f and 60g formed of two vertical lines.

In the semiconductor light emitting device 1 according to the embodiment, the first electrodes 60a to 60e, which form the horizontal lines, are disposed in substantially parallel to and equally separated from each other. More specifically, the Y coordinates of the first electrodes 60a to 60e are y0 to y4, respectively. The coordinate y0 is the Y coordinate of the lower side of the semiconductor light emitting device 1. The coordinate y4 is the Y coordinate of the upper side of the semiconductor light emitting device 1. Since each side of the semiconductor chip of the semiconductor light emitting device 1 has the length L0, y4−y0≈L0. The coordinate y2 is located in a position that halves one side of the semiconductor light emitting device 1 in the Y-axis-direction. The coordinate y1 is located in a position that halves the length between y2 and y0. The coordinate y3 is located in a position that halves the length between y4 and y2. The first electrodes 60a to 60e, which are horizontal lines in the semiconductor light emitting device 1, are disposed symmetrically with respect to a line passing through the coordinate y2 and parallel to the X axis. In other words, the distances between the first electrodes 60a to 60e, which form the horizontal lines, are y1−y0=y2−y1=y3−y2=y4−y3. One end of the first electrode 60b is connected to the electrode pad 70a, which is one of the two electrode pads, in the position x0. One end of the first electrode 60d is connected to the electrode pad 70b, which is the other electrode pad, also in the position x0.

The first electrodes 60f and 60g, which form the vertical lines, are disposed in substantially parallel to each other in the vicinity of the opposite ends of the semiconductor light emitting device 1 in the X-axis-direction. More specifically, the first electrode 60f is disposed in the position x0, and the first electrode 60g is disposed in a position X=x2. Since the sides of the semiconductor chip of the semiconductor light emitting device 1 that are parallel to the X axis each have the length L0, the coordinate x2 is located in a position shifted from the origin O by L0. The opposite ends of each of the first electrodes 60f and 60g are connected to the opposite ends of the first electrodes 60a and 60e, which form part of the horizontal lines. One end of each of the first electrodes 60b, 60c, and 60d, which form the part of the horizontal lines, is connected to the first electrode 60g. The first electrode 60f is divided into first electrodes 60f1, 60f2, 60f3, and 60f4. One end of the first electrode 60f1, which is one of the divided electrodes, is connected to the electrode pad 70a, which is one of the two electrode pads, in a position y1−Lp/2. The other end of the first electrode 60f1 is connected to one end of the first electrode 60a, which forms one of the horizontal lines, at coordinates (x0, y0). One end of the first electrode 60f2, which is one of the divided electrodes, is connected to the electrode pad 70a in a position y1+Lp/2. The other end of the first electrode 60f2 is connected not only to one end of the first electrode 60c, which forms one of the horizontal lines, but also to one end of the first electrode 60f3. The connection position is the position y2. The other end of the first electrode 60f3, which is one of the divided electrodes, is connected to the electrode pad 70b, which is the other electrode pad, in a position y3−Lp/2. One end of the first electrode 60f4, which is one of the divided electrodes, is connected to the electrode pad 70b in a position y3+Lp/2, and the other end of the first electrode 60f4 is connected to one end of the first electrode 60e, which forms one of the horizontal lines, in the position y4.

The first electrodes 60a to 60e, which form the horizontal lines, are so formed that the length thereof in the Y-axis-direction, that is, the width of the first electrodes 60a to 60e decreases from the positions where they are connected to one of the vertical lines and the electrode pads along the positive direction of the X axis. The width of the first electrodes 60a to 60e gradually decreases from the position x0 to a predetermined position x1 on the X axis and is maintained constant from the position x1 along the positive direction of the X axis. The first electrode 60f1 to 60f4, which form one of the vertical lines, are wide in the vicinity of the positions where they are connected to the electrode pads 70a and 70b, and gradually narrow along the direction the electrodes extend with distance from the electrode pads 70a and 70b. More specifically, in a segment l1 between the position y1 and the position y0, a segment l2 between the position y2 and the position y1, a segment l3 between the position y3 and the position y2, and a segment l4 between the position y4 and the position y3, the first electrodes 60f1 to 60f4 have a fixed width wa. The portions from the positions x1 to x2 along the horizontal lines and the first electrode 60g, which forms one of the vertical lines, all have a fixed width wb. In a segment l5, which is formed of the first electrodes 60a and 60b from the positions x1 to x2 and the first electrode 60g from the positions y0 to y1, the electrodes all have the fixed width wb. In segments l6 to l8, the electrodes all have the fixed width wb. Since the first electrodes 60a to 60e, which form the horizontal lines, are disposed at equal intervals in the Y-axis-direction, the first electrodes that belong to the segments l5 to l8, where the width is the fixed wb described above, are set to have the same length. Similarly, the first electrodes that belong to the segments l1 to l4, where the width is the fixed wa, are set to have the same length. The lengths in the segments described above can be arbitrarily set in accordance with a current density distribution and other factors. Since the first electrode 60 is formed of line-shaped portions, the width of the first electrode in the specification is defined to be the length in the direction perpendicular to the direction in which the line-shaped first electrode extends. For example, since the first electrodes 60a to 60e, which form the horizontal lines, extend in the X-axis-direction, the width of the first electrodes 60a to 60e is the length thereof in the Y-axis-direction. Since the first electrodes 60f and 60g, which form the vertical lines, extend in the Y-axis-direction, the width of the first electrodes 60f and 60g is the length thereof in the X-axis-direction.

In the semiconductor light emitting device 1 according to the embodiment, the current block layer 50 is provided in the vicinity of the positions where the first electrodes 60f1, 60b, 60f2, 60f3, 60d, and 60f4 are connected to the electrode pads 70a and 70b. The current block layer 50 is further so provided that it surrounds the outer circumference of the semiconductor light emitting device 1. For example, the current block layers 50 formed on the first electrodes 60b and 60d extend from the position x0 to a position xb. The current block layers 50 are so provided that they cover the first electrodes 60b and 60d in the range from the positions x0 to xb. Let Lb be the length from the positions x0 to xb, and the current block layer 50 provided in the position where the first electrode 60f1 is connected to the electrode pad 70a is also set to have the length Lb in the Y-axis-direction. Similarly, the current block layer 50 provided in the position where the first electrode 60f2 is connected to the electrode pad 70a is also set to have the length Lb in the Y-axis-direction. The current block layers 50 provided in the positions where electrodes are connected to the electrode pad 70b are also set to have the length Lb in the Y-axis-direction.

The current block layer 50 is further formed along the first electrode 60g, which forms one of the vertical lines provided in an outer circumferential portion of the semiconductor light emitting device 1, in such a way that current block layer 50 covers a portion outside the thus formed first electrode 60g, as shown in FIG. 3A.

The first electrode 60 is so formed that the width thereof decreases to the position x1 in the positive direction of the X axis but is constant from x1 in the positive direction of the X axis, as shown in FIG. 3B. The width wb of the constant portion of first electrode is set to be equal to the width wb of the first electrode 60g in FIG. 3A.

A description will next be made of a principle in accordance with which the semiconductor light emitting device 1 according to the embodiment operates.

In recent years, a semiconductor light emitting device has improved quality of the semiconductor layer and hence has improved light emission efficiency when driven at high current density and has been increasingly required to further increase the output and decrease the size of the chip. For example, a semiconductor light emitting device having a chip size of as small as approximately 1 to 2 mm square and having a rated output of as high as approximately 3 A has been commercialized. To improve the light emission efficiency, the current density needs to be further increased. To increase the current density per chip, it is necessary to not only increase the width of electrodes that supply the first and second semiconductor layers with current so that current of a large magnitude flows therethrough but also homogenize the current density for prevention of electromigration and hence improvement in reliability. On the other hand, to increase the width of an electrode on the side where light is outputted, which is the first electrode connected to the first semiconductor layer (n-type semiconductor layer) in many cases, it is necessary to do so in such a way that the increased first electrode does not prevent the light output. The first electrode cannot therefore spread over the entire light emitting surface. In general, the flow of electrons flowing from the first electrode 60 has a large magnitude in the vicinity of the electrode pads 70a and 70b, but the magnitude decreases with distance from the electrode pads 70a and 70b because the electrons are shunted into an active layer. In view of the fact described above, the current density can be homogenized by shaping the first electrode 60 in such a way that the electrode is wide in the vicinity of the positions where the first electrode 60 is connected to the electrode pads 70a and 70b whereas the electrode narrows with distance from the electrode pads 70a and 70b.

The first electrode 60 is connected to the electrode pad 70 in the position x0 and extends to a position x3, as shown in FIG. 4A. The width of the first electrode 60 in the position x0 is wa, and the width in the position x3 is wb, which is less than wa. In the example shown in FIG. 4A, the width wb is zero in the position x3. In the example, the width of the first electrode 60 from the positions x0 to x3 is set to decrease roughly at a fixed rate. In other words, the edge of the first electrode 60 is linearly formed.

As the width of the first electrode 60 decreases, the area per unit length of the first electrode 60 where the first electrode 60 is in contact with the first semiconductor layer 10 decreases, and it is therefore believed that the ratio of the electrons shunted into the semiconductor layer 80 decreases. In view of the assumption described above, the width of the first electrode 60 may be so set that the decreasing rate decreases with the distance from the electrode pad 70, as shown in FIG. 4B.

When the contact surface of the first electrode 60 vanishes in the vicinity of the end of the first electrode 60, the amount of injected current significantly decreases. It is therefore undesirable from the viewpoint of light emission efficiency in some cases to set the width of the first electrode 60 to be zero at the end of the first electrode 60, as shown in FIGS. 4A and 4B. It is therefore desirable to set the position x1 between the position x0, where the first electrode 60 is connected to the electrode pad 70, and the end x4 of the first electrode 60, gradually decrease the width of the first electrode 60 from the positions x0 to x1, and maintain the width from the positions x1 to x4 at the fixed value wb, which is the width in the position x1, as shown in FIG. 4C.

In the semiconductor light emitting device 1 according to the embodiment, the current block layer 50 can be arbitrarily shaped and arbitrarily positioned. Providing the current block layer 50 at a location where the current density increases more effectively allows suppression of an increase in the current density. Since it is believed that the current density is maximized in the vicinity of the positions where the first electrode 60 is connected to the electrode pads 70a and 70b as described above, providing the current block layers 50 in the vicinity of the connection positions allows further effective suppression of an increase in the current density.

An effect and an advantage of the semiconductor light emitting device 1 according to the embodiment will next be described in comparison with a semiconductor light emitting device according to Comparative Example.

Figure 5:
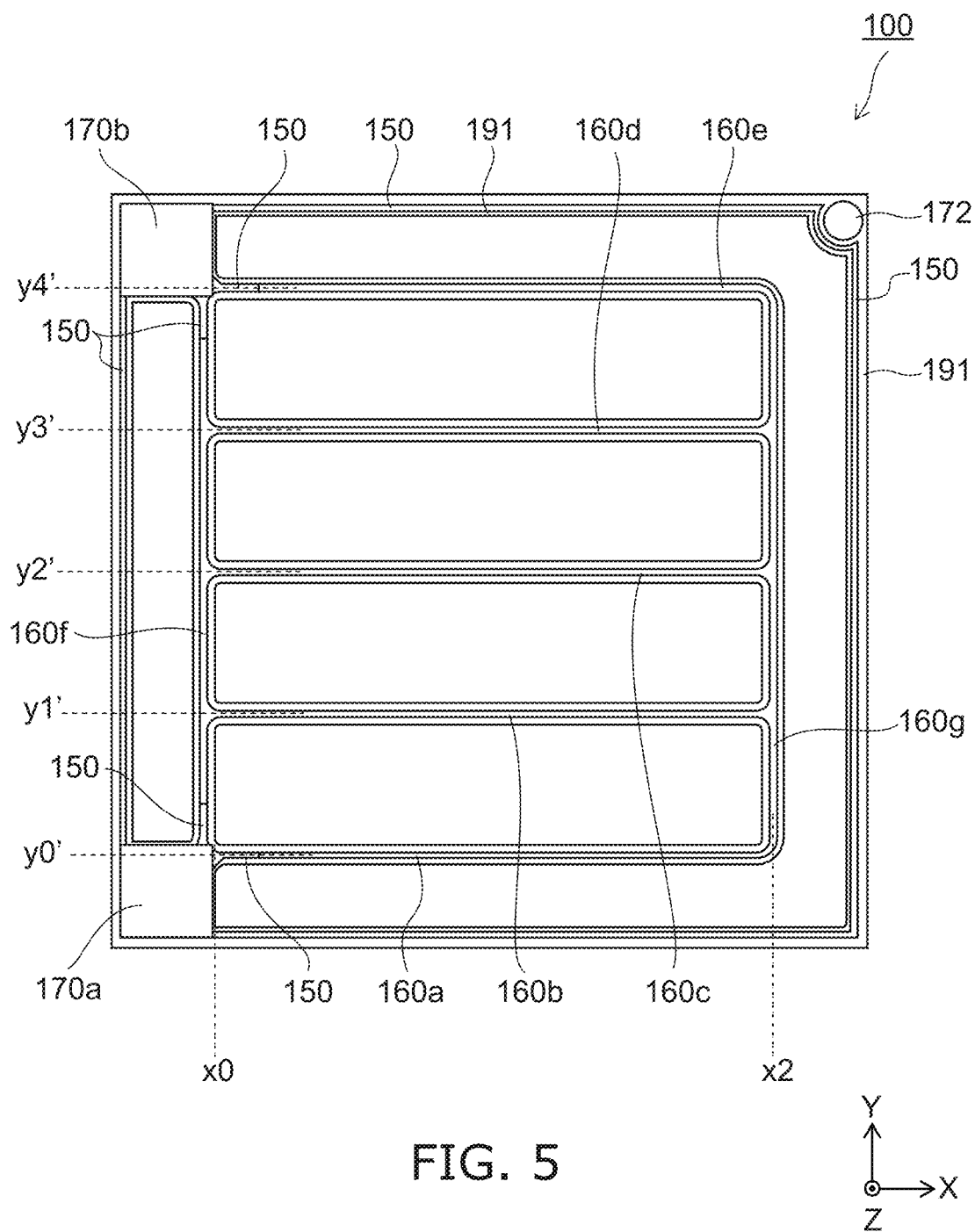
FIG. 5 is a perspective plan view illustrating a semiconductor light emitting device according to Comparative Example.

FIG. 5 is a perspective plan view illustrating a semiconductor light emitting device 100 according to Comparative Example.

Figure 6A:
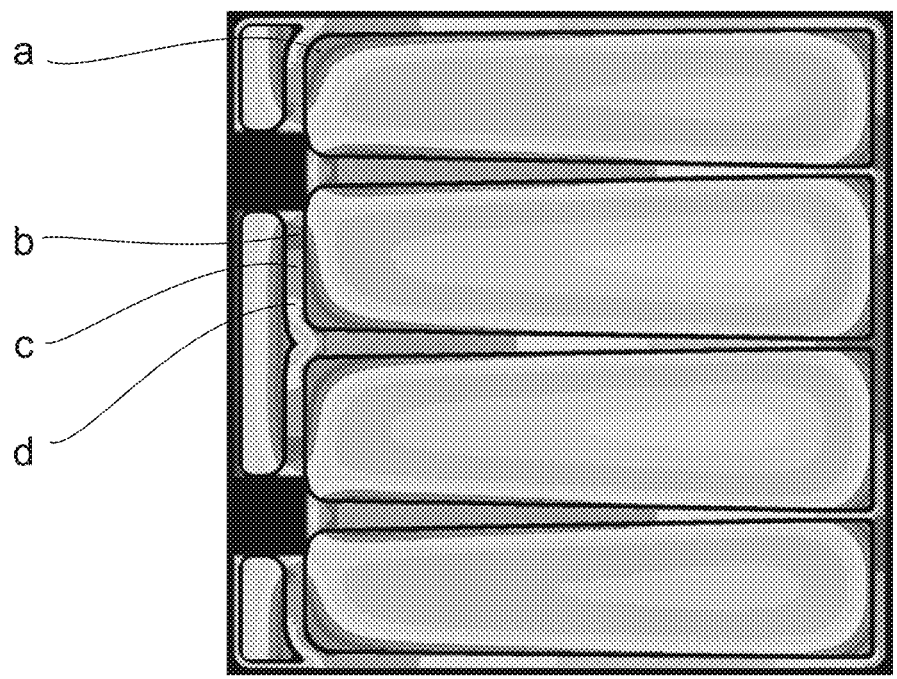
FIG. 6A is a graph illustrating the current density distribution in the semiconductor light emitting device according to the embodiment.
Figure 6B:
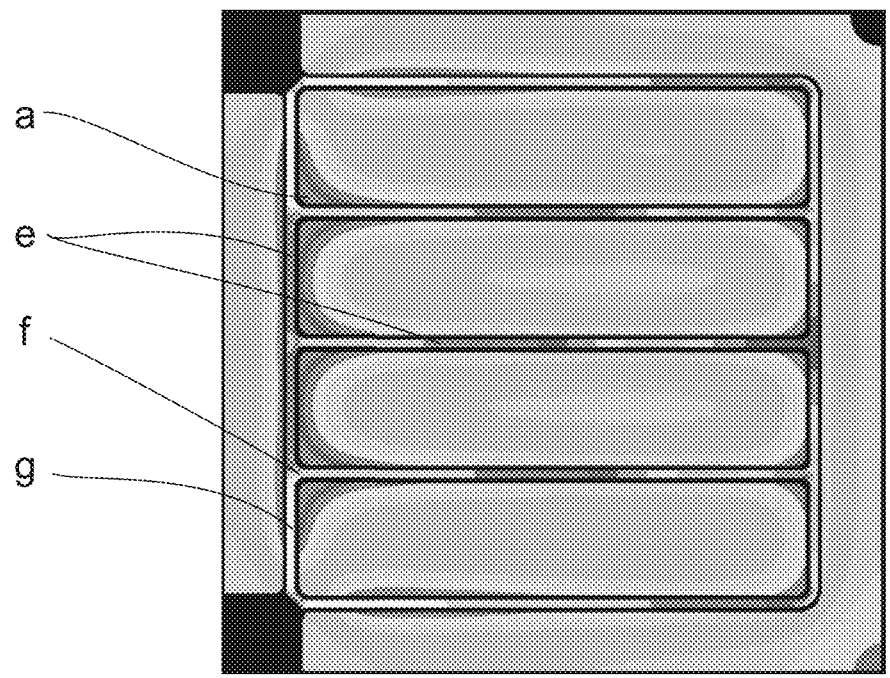
FIG. 6B is a graph illustrating the current density distribution in the semiconductor light emitting device according to Comparative Example.

FIG. 6A is a graph illustrating the current density distribution in the semiconductor light emitting device 1 according to the embodiment, and FIG. 6B is a graph illustrating the current density distribution in the semiconductor light emitting device 100 according to Comparative Example.

The semiconductor light emitting device 100 according to Comparative Example includes line-shaped first electrodes 160a to 160g, as shown in FIG. 5. The semiconductor light emitting device 100 according to Comparative Example has the same cross-sectional structure as the cross-sectional structure of the semiconductor light emitting device 1 according to the embodiment except the current block layer 50. Further, the semiconductor light emitting device 100 according to Comparative Example is formed of a semiconductor chip having a substantially square shape of L0×L0.

The first electrodes 160a to 160e, which form the horizontal lines, are arranged in parallel to the X axis at substantially equal intervals. In the semiconductor light emitting device 100 according to Comparative Example, electrode pads 170a and 170b are disposed in upper and lower end portions on the side where the origin O is present. The first electrode 160f, which forms one of the vertical lines, has one end connected to the electrode pad 170a and to one end of the first electrode 160a. The other end of the first electrode 160f is connected to the electrode pad 170b, which is the other electrode pad, and to one end of the first electrode 160e. The first electrode 160g, which forms the other vertical line, has one end connected to the other end of the first electrode 160a and the other end connected to the other end of the first electrode 160e. One end of each of the first electrodes 160b to 160d is connected to the first electrode 160f, and the other end of each of the first electrodes 160b to 160d is connected to the first electrode 160g. A first electrode 160 (not shown), which is connected to the electrode pads 170a and 170b, is formed around the outer circumference of the semiconductor light emitting device 100, and a current block layer 150 is formed along the first electrode 160. In the example of the semiconductor light emitting device 100 according to Comparative Example, an electrode pad 172 for a second electrode 140 is disposed at a corner of the side facing away from the side where the first electrode pads 170a and 170b are disposed.

In the semiconductor light emitting device 100 according to Comparative Example, each of the first electrodes 160a to 160g has a line-shaped structure in which the electrode has a fixed width along the direction in which the electrode extends. Further, no current block layer 50 is formed except the current block layer 50 in the outer circumferential portion.

In the semiconductor light emitting device 1 according to the embodiment, the current density is maximized in the vicinity of the boundary between the current block layer 50 and the first electrode 60, that is, in a region b, where the current density is 400 kA/cm$^2$ at the maximum, as shown in FIG. 6A. In a region c, the current density is not more than 200 kA/cm$^2$, and the current density in a region d is 100 kA/cm$^2$. In a light emitting layer region around the first electrode, a bent portion of the first electrode 60, for example, the portion where the first electrode 60a is connected to the first electrode 60/1 (region a) has a portion where the current density is higher than 200 kA/cm$^2$. In the other portions of the light emitting layer region, the current density is not more than 200 kA/cm$^2$.

On the other hand, in the semiconductor light emitting device 100 according to Comparative Example, the current density is higher than 1000 kA/cm$^2$ in a region g in the vicinity of the electrode pads for the first electrode, as shown in FIG. 6B. The current density is higher than 600 kA/cm$^2$ in a region f, and the current density is higher than 400 kA/cm$^2$ in a region e. The graph shown in FIG. 6A is obtained by performing a simulation in no consideration of the electrode pad 72 for the second electrode. Graphs of the current density distribution in variations and other embodiments described below are also obtained by performing simulations in no consideration of the electrode pad 72 as appropriate.

Each of the semiconductor light emitting device 1 according to the embodiment and the semiconductor light emitting device 100 according to Comparative Example has a chip size of 1.4 mm square, and each of the electrode pads has a square shape of 100×100 µm. The first electrode has a thickness of 1.8 µm in both the semiconductor light emitting devices. It is assumed that the first electrode is made of Al and has a resistivity of 2.8 µΩcm. A case where a drive current of 1.5 A is allowed to flow is considered.

The semiconductor light emitting device 100 according to Comparative Example will first be considered.

The width of the first electrode 160 in the semiconductor light emitting device 100 according to Comparative Example is set at 15 µm, which is a typically used width. The semiconductor light emitting device 100 according to Comparative Example has the two electrode pads 170a and 170b, to each of which two first electrodes 160 are connected. The total width of the first electrodes 160 is 60 µm, which means that the maximum current density in the first electrodes is higher than 1390 kA/cm$^2$ (=1.5 A/(60 µm×1.8 µm)). In the pattern of the first electrode shown in FIG. 5, assuming that current uniformly branches into the five horizontal lines, the current density in each of the horizontal lines is at least 1110 kA/cm$^2$. In this case, the current density in each of the vertical lines is higher than 1670 kA/cm$^2$. The density of heat (power density) generated by Joule heat in each of the vertical lines is therefore higher than 1400 W/cm$^2$.

In consideration of a specific application instance, when an LED is assumed to consume a power of 5 W, the average power density is 357 W/cm$^2$. When the LED is covered with an enclosure onto which a fluorophore is applied to form a white LED and a reasonable value of power conversion efficiency of the LED is set at 40%, the average density of heat generated by the LED is 214 W/cm$^2$. The generated heat density calculated above in association with the first electrode reaches a value 6.5 times the generated heat density associated with the light emitting portion (=1400/214), possibly resulting in a problem of reliability.

When electromigration is considered in relation to reliability, an Al electrode accepts 200 kA/cm$^2$ at the maximum. The semiconductor light emitting device 100 according to Comparative Example therefore has a portion where the current density exceeds 8 times the acceptable value. Using Si-containing Al (AlSi) as the material of the first electrode allows improvement in resistance against electromigration. Even in this case, however, the acceptable value is 400 kA/cm$^2$, which is still 4 times higher than the calculation result described above. In the simulation result shown in FIG. 6B, current densities higher than 400 kA/cm$^2$ can be observed in many portions.

In the semiconductor light emitting device 1 according to the embodiment, the number of first electrodes connected to each of the electrode pads is increased to increase the current-flowing cross-sectional area in the vicinity of the positions where the first electrodes are connected to the electrode pad, as compared with the semiconductor light emitting device 100 according to Comparative Example. In the semiconductor light emitting device 1 according to the embodiment, to connect the first electrode 60 to each of the electrode pads 70a and 70b in three directions, the electrode pads 70a and 70b are located in the positions y1 and y3. The position y1 is a position that internally divides a side parallel to the Y axis and having the length L0 at a ratio of 1:3, and the position y3 is a position that internally divides the side parallel to the Y axis and having the length L0 at a ratio of 3:1.

In the semiconductor light emitting device 1 according to the embodiment, the width wa at one end of the first electrode 60 connected to the electrode pads 70a and 70b is set at 50 µm. The current density in a portion where the current density is maximized in the semiconductor light emitting device 1 according to the embodiment is one-fifth of the current density in the semiconductor light emitting device 100 according to Comparative Example (=60 µm/(50 µm×6)). Further, the current block layer 50 is provided in the positions where the first electrode 60 is connected to the electrode pads 70a and 70b to disperse the electron-flowing direction so as to prevent current concentration for a further decrease in the current density. The semiconductor light emitting device 1 according to the embodiment thus achieves a current density not more than 400 kA/cm$^2$ in the first electrode 60. To consider prevention of occurrence of electromigration, using AlSi as the material of the first electrode 60 allows sufficient reliability to be achieved. Further, setting the minimum electrode width wb at 10 µm allows current supplied to the semiconductor layer 80 even in a location separate from the electrode pads 70a and 70b, whereby homogenization of the current density can be achieved. The minimum electrode width is desirably set at 4 µm or greater or at least twice the thickness of the first electrode 60 in order to avoid occurrence of a local increase in the current density at the surface where the first electrode 60 is in contact with the first semiconductor layer 10.

As described above, in the semiconductor light emitting device 1 according to the embodiment, since the width of the first electrode 60 decreases with distance from the electrode pads 70a and 70b, a decrease in the light emission area can be suppressed, whereby the light emission efficiency can be improved.

Further, in the semiconductor light emitting device 1 according to the embodiment, the first electrode 60 and the electrode pads 70a and 70b are symmetrically arranged with respect to a line that halves two opposing sides of the semiconductor chip. Further, the first electrodes 60a to 60c are symmetrically arranged with respect to a line that halves two opposing sides of the electrode pad 70a, and the first electrodes 60c to 60e are symmetrically arranged with respect to a line that halves two opposing sides of the electrode pad 70b. The current density distribution is therefore homogenized, whereby the semiconductor light emitting device 1 can be driven with current of a large magnitude.

Further, in the semiconductor light emitting device 1 according to the embodiment, the current block layer 50 is provided in a portion where the current density locally increases, that is, in the vicinity of the portions where the first electrode 60 is connected to the electrode pads 70a and 70b. In the portions of the first electrode 60 where the current block layer 50 is provided, the electron current is scattered by the step formed by the current block layer 50 and located in the first electrode 60, so that the magnitude of the momentum vector decreases. As a result, current concentration does not tend to occur in the portions, and an increase in the current density is suppressed.

Variation 1 of First Embodiment

FIG. 7A is a perspective plan view illustrating a semiconductor light emitting device according to Variation 1 of the first embodiment. FIG. 7B is a cross-sectional view taken along the line E-E' in FIG. 7A.

In the semiconductor light emitting device 1 according to the first embodiment, current is extracted from the second electrode by using the backside contact, but current may instead be extracted without using the backside contact but by using an electrode pad provided on the same surface on which the electrode pads for the first electrode are provided.

In a semiconductor light emitting device 1a according to the variation, the first electrodes 60a to 60e, which form the horizontal lines, are arranged at substantially equal intervals, as shown in FIG. 7A. The first electrodes 60f and 60g, which form the vertical lines, are disposed in substantially parallel to each other in the vicinity of the ends of the semiconductor light emitting device 1a in the X-axis-direction. The semiconductor light emitting device 1a according to the variation differs from the semiconductor light emitting device 1 according to the first embodiment in that an electrode pad 72b for the second electrode 40 is disposed between a first electrode 60g1 and a first electrode 60g2, into which the first electrode 60g, which forms one of the vertical lines, is divided and an electrode pad 72a is disposed between the first electrode 60g2 and a first electrode 60g3. Since the electrode pads 72 for the second electrode 40 are disposed in the position described above, the length of the first electrodes 60b and 60d, which form part of the horizontal lines, in the X-axis-direction is shorter than the length of the first electrodes 60a, 60c, and 60e, which form the other horizontal lines.

The electrode pads 72a and 72b for the second electrode 40 are electrically connected to the second electrode 40 via the back metal 92, which is formed in an elongated shape, as shown in FIG. 7B. In the variation, since current is not extracted through a backside contact, no backside contact is formed on a support substrate 95a. Further, the support substrate 95a, which is not electrically connected to the second electrode 40, can be made of an insulating material. For example, the support substrate 95a can be formed of a ceramic substrate made, for example, of an aluminum nitride (AlN). To further improve thermal conductivity, the support substrate 95a may instead be made of a conductive material having excellent thermal conductivity. In this case, the support substrate 95a is connected to the support layer 93 via an insulating layer.

In the semiconductor light emitting device 1a according to the variation, current flowing between the first electrode 60 and the second electrode 40 not only flows in the horizontal direction but also is extracted in the horizontal direction and supplied to an external circuit. In the semiconductor light emitting device 1a according to the variation, the support substrate 95a is not part of the current path.

The semiconductor light emitting device 1a according to the variation can be directly mounted on a highly heat dissipative substrate made of a metal along with other semiconductor chips. Using a material having high thermal conductivity, such as an AlN ceramic, as the material of the support substrate 95a allows reduction in heat resistance and hence allows application of power of a large magnitude, whereby the light emission efficiency can be improved.

Variation 2 of First Embodiment

In the semiconductor light emitting device 1 according to the first embodiment, the current block layer 50 is provided in the vicinity of the portions where the first electrode 60 is connected to the electrode pads 70a and 70b. Skillfully shaping the current block layer 50 allows improvement in resistance against electromigration.

FIGS. 8A to 8E are plan views showing examples of part of a semiconductor light emitting device according to Variation 2 of the first embodiment.

Figure 8A:
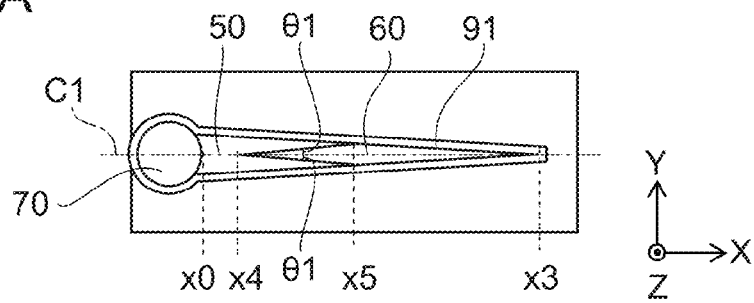
FIG. 8A is a plan view showing example of part of a semiconductor light emitting device according to Variation 2 of the first embodiment.

The first electrode 60 in a semiconductor light emitting device 1a according to Variation 2 is connected to an electrode pad 70 in a position x0, as shown in FIG. 8A. In the position x0, the width of the first electrode 60 is wa. The first electrode 60 extends along the X-axis-direction to a position x3. The width wb of the first electrode 60 in the position x3 is zero. The width of the first electrode 60 decreases at a fixed rate. The current block layer 50 is provided on part of the first electrode 60. The first electrode 60 and the current block layer 50 are so formed that the current block layer 50 covers the first electrode 60 from the position x1 to a position x4. The first electrode 60 and the current block layer 50 are symmetrically disposed with respect to a center line c1. From the position x4 to a position x5, the current block layer 50 has portions that start from the center line c1 of the first electrode 60 on the Y axis extending toward the edges of the first electrode 60 and are inclined by an angle $\theta_1$. The angle $\theta_1$ is an angle between the center line c1 and a line that connects the position on the center line c1 in the position x4 to the position of either of the edges of the first electrode 60 in the position x5. In the process of forming the current block layer 50 by using an insulating layer, after the current block layer 50 is formed on the first electrode 60, a mask pattern can be used to readily form the current block layer 50 having the shape described above.

Figure 8B:
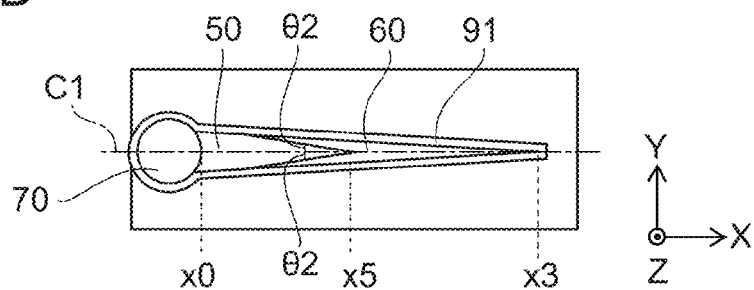
FIG. 8B is a plan view showing example of part of a semiconductor light emitting device according to Variation 2 of the first embodiment.

FIG. 8B shows another example of the shape of the current block layer 50 formed on the first electrode 60. The shape of the first electrode 60 is the same as the shape thereof in FIG. 8A. The current block layer 50 is so shaped that the width thereof decreases toward the position x5 at a rate greater than the rate at which the first electrode 60 decreases. An angle $\theta_2$ is an angle between the center line c1 and a line that connects the position of either of the edges of the first electrode 60 in the position x0 to the position on the center line c1 in the position x5. The shape of the thus configured current block layer 50 is suitable for a case where a mask pattern for forming the current block layer 50 is formed by inactivating or otherwise treating the surface where the first electrode 60 is in contact with the first semiconductor layer 10, for example, by using ion implantation.

Electromigration is believed to occur when a conductor, such as an electrode, has a bent portion or a stepped portion that abruptly changes the vector of the flow of electrons flowing through the conductor so that a large momentum vector is given to metal atoms that form the conductor. In view of the assumption described above, it is effective to incline in advance an edge of the current block layer 50 with respect to the direction of the electron current to reduce the magnitude of the momentum vector in the direction of the electron current. In the example described above, the edges of the current block layer 50 are inclined to the direction in which the electrons and the like flow. As a result, the momentum vector of the electrons and the like in one direction decreases, which reduces the momentum received by the metal atoms that form the first electrode 60, whereby occurrence of electromigration is prevented. To effectively prevent occurrence of electromigration with no abrupt change in the direction of the electron current, the following relationship is desirably satisfied: $\theta 1, \theta 2 \leq 30°$.

Figure 8C:
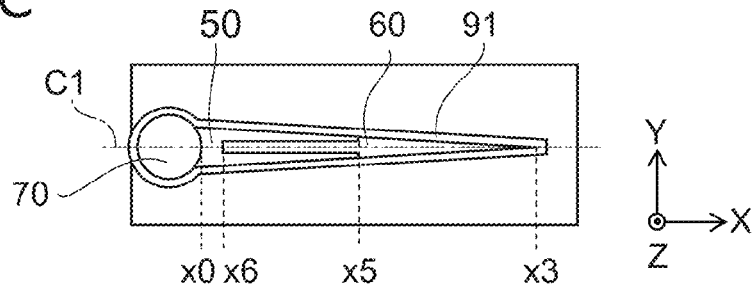
FIG. 8C is a plan view showing example of part of a semiconductor light emitting device according to Variation 2 of the first embodiment.

The current block layer 50 may instead be so configured that it has a portion parallel to the direction of the flow of the electrons and the like flowing through the first electrode 60, as shown in FIG. 8C. The current block layer 50 covers the first electrode 60 from the position x0 to a position x6. The current block layer 50 is formed in parallel to the X axis along the edges of the first electrode 60 in the X-axis-direction from the positions x6 to x5 with no current block layer 50 formed in a central portion of the first electrode 60 in the Y-axis-direction. In this case, although the current block layer 50 is formed along the direction in which the electrons and the like flow, the step in the Z-axis-direction is present in a cross-sectional view of the first electrode 60 (FIG. 1B and others, for example), so that a momentum vector in a direction different from the direction in which the electrons and the like flow is produced, and the momentum vector along the direction in which the electrons and the like flow decreases accordingly, whereby resistance against electromigration is improved.

Figure 8D:
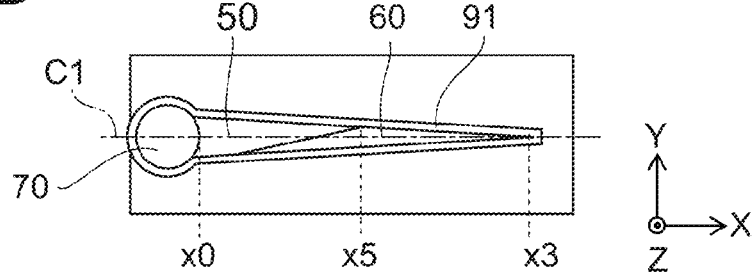
FIG. 8D is a plan view showing example of part of a semiconductor light emitting device according to Variation 2 of the first embodiment.
Figure 8E:
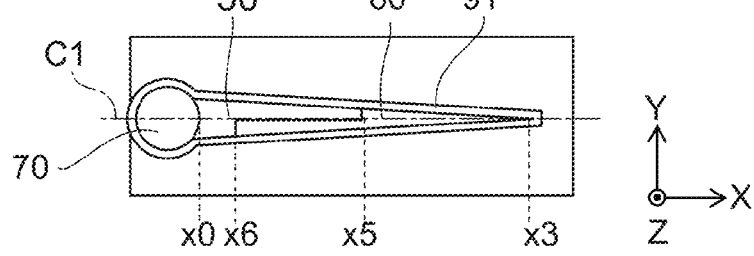
FIG. 8E is a plan view showing example of part of a semiconductor light emitting device according to Variation 2 of the first embodiment.

The shape of the current block layer 50 is not necessarily symmetric with respect to the center line c1, as described above. The current block layer 50 may instead be so set that the width thereof decreases along the first electrode 60 at a changing rate greater than the changing rate at which the width of the first electrode 60 decreases, as shown in FIG. 8D. That is, the first electrode 60 may be so set that the width thereof is minimized in the position x3, and the current block layer 50 may be so set that the width thereof is minimized in the position x5 between the positions x0 and x3. Still instead, the current block layer 50 may be so configured that the width thereof changes stepwise in the position x5, as shown in FIG. 8E.

As described above, inclining the shape of the current block layer 50 with respect to the direction in which the current flows or changing the cross-sectional area of a cross section perpendicular to the direction in which the current flows to effectively provide a step allows a decrease in the magnitude of the momentum vector in the direction in which the current flows. Therefore, even when the magnitude of current allowed to flow is fixed, the resistance against electromigration can be improved. It is noted that the direction in which the electrons and the like flow is a direction in which a potential difference occurs. In the variation, the current flows toward or into the first electrode 60 from the electrode pads 70a and 70b and reaches a position on the first electrode 60 that is separate from the electrode pads 70a and 70b. The direction in which the current flows may therefore be considered to be the direction in which the first electrode 60 extends.

Variation 3 of First Embodiment

Figure 9:
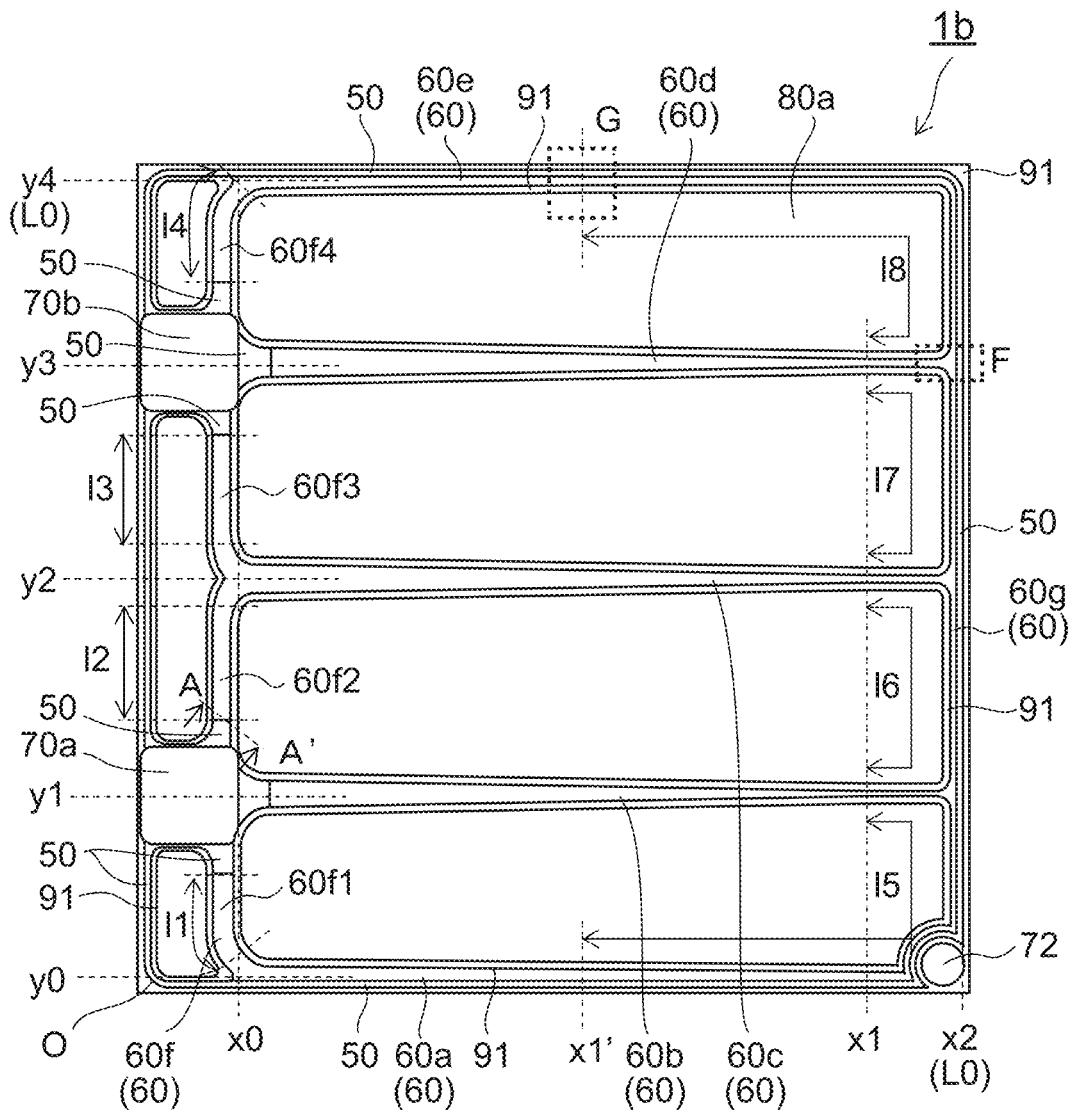
FIG. 9 is a perspective plan view illustrating a semiconductor light emitting device according to Variation 3 of the first embodiment.
Figure 10A:
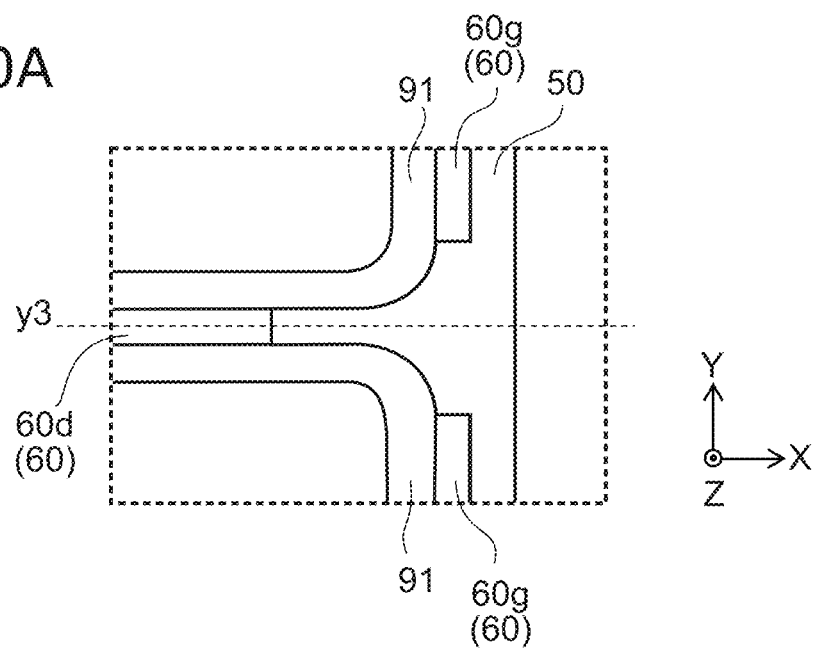
FIG. 10A is an enlarged view of a portion F in FIG. 9.
Figure 10B:
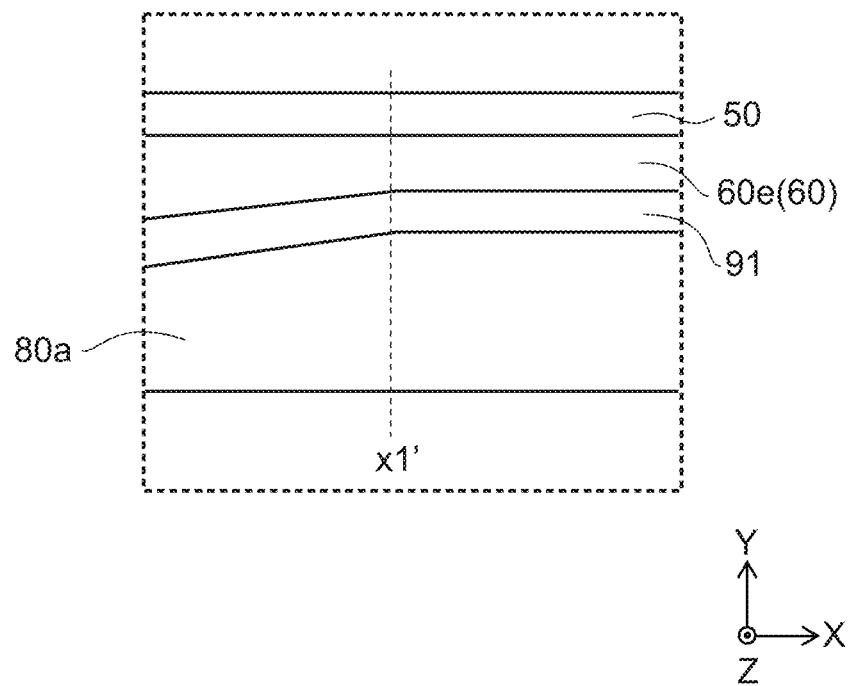
FIG. 10B is an enlarged view of a portion G in FIG. 9.

FIG. 9 is a perspective plan view illustrating a semiconductor light emitting device according to Variation 3 of the first embodiment. FIG. 10A is an enlarged view of a portion F in FIG. 9. FIG. 10B is an enlarged view of a portion G in FIG. 9.

A semiconductor light emitting device 1b according to Variation 3 differs from the semiconductor light emitting device 1 according to the first embodiment in terms of the shape of the first electrodes 60a and 60e and the shape of the current block layer 50. The same portions as those in the semiconductor light emitting device 1 according to the first embodiment have the same reference characters and will not be described in detail.

In the semiconductor light emitting device 1b according to the variation, among the first electrodes 60a to 60e, which form the horizontal lines, the first electrode 60a disposed in the position y0 on the Y axis and the first electrode 60e disposed on the position y4 on the Y axis change in terms of width from the positions x0 to x1', as shown in FIG. 9. The first electrodes 60b, 60c, and 60d disposed in the positions y1, y2, and y3 change in terms of width from the positions x0 to x1. The position x1' is present between the positions x0 and x1. That is, the width of the first electrodes 60a and 60e disposed along the upper and lower sides of the semiconductor light emitting device 1b is so set that it decreases at a rate greater than the rate at which the width of the first electrodes 60b, 60c, and 60d, which are disposed between the first electrodes 60a and 60e, decreases. In this example, the lengths of the following segments are set as follows: The length of the segment 15 is equal to the length of the segment 18; the length of the segment 16 is equal to the length of the segment 17; and the length of the segments 15 and 18 is greater than the length of the segments 16 and 17. The lengths of the segments 11 to 14 are the same as those in the semiconductor light emitting device 1 according to the first embodiment.

The current block layer 50 is so provided that it covers the positions of the intersections where the first electrodes 60b, 60c, and 60d are connected to the first electrode 60g, as shown in FIG. 10A. The current block layer 50 is further provided along the outermost circumference of the first electrodes 60a and 60e formed along the outer circumference, as shown in FIG. 10B.

The changes of the shapes described above allow the current density distribution to be more homogenized than the current density distribution shown in FIG. 6A.

Variation 4 of First Embodiment

Figure 11A:
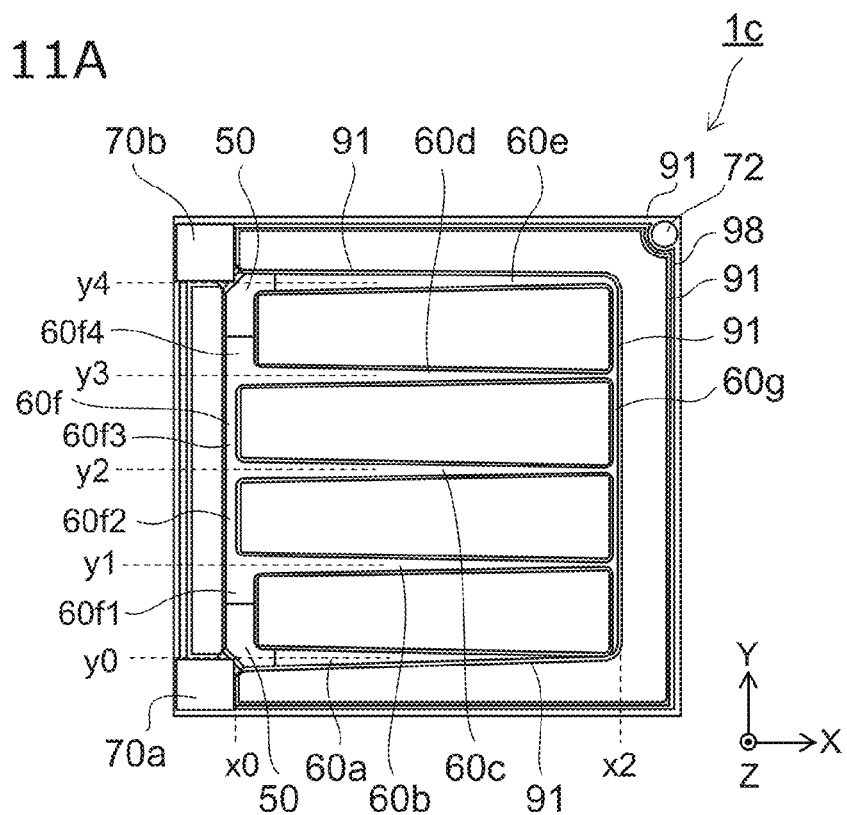
FIG. 11A is a perspective plan view showing example of a semiconductor light emitting device according to Variation 4 of the first embodiment.
Figure 11B:
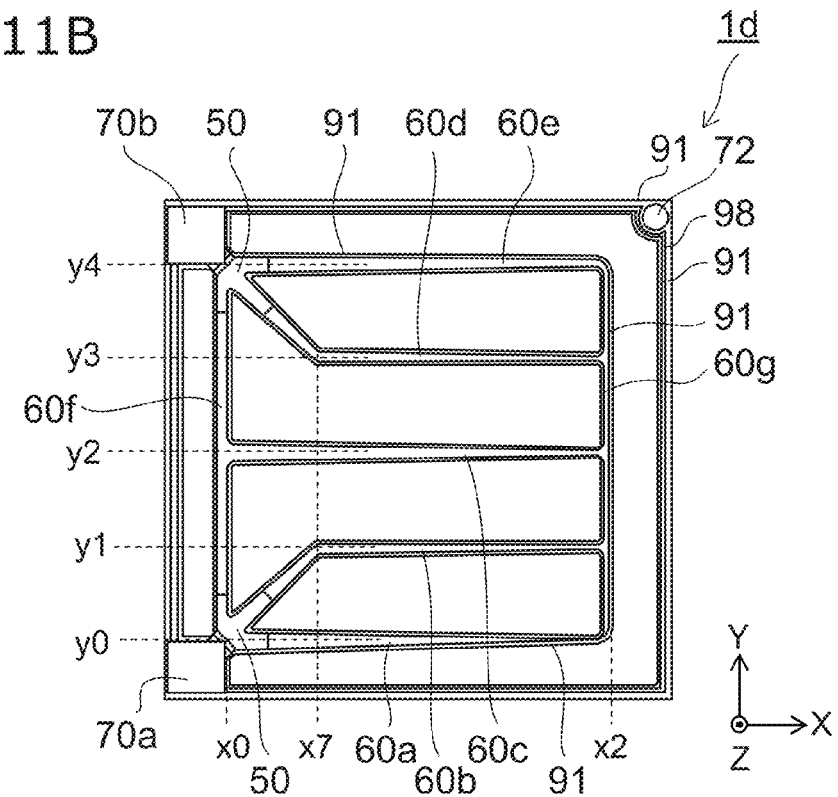
FIG. 11B is a perspective plan view showing example of a semiconductor light emitting device according to Variation 4 of the first embodiment.

FIGS. 11A and 11B are perspective plan views showing examples of a semiconductor light emitting device according to Variation 4 of the first embodiment.

In a semiconductor light emitting device 1c according to the variation, the electrode pads 70a and 70b are disposed on the lower and upper sides of the semiconductor light emitting device 1c, as shown in FIG. 11A. The positions of the electrode pads 70a and 70b are restricted in some cases by the structure of an enclosure in which the semiconductor chip is accommodated and other factors. In the semiconductor light emitting device 1 according to the first embodiment, the current density is lowered by connecting the first electrode 60 to three sides of each of the electrode pads 70a and 70b. In a case where the positional arrangement described above cannot be employed due, for example, to the restriction on the structure of the enclosure, the first electrode 60 in the positions where it is connected to the electrode pads 70a and 70b may, for example, be further widened. In this case, since it is believed that no current of a large magnitude flows through the first electrodes 60f2 and 60f3, which form part of the vertical lines, the first electrodes 60f2 and 60f3 may be set to be narrow.

The first electrodes 60b and 60d of a semiconductor light emitting device 1d may be inclined by approximately 45° and −45° respectively and allowed to extend from the electrode pads 70a and 70b in the range from the position x0 to a position x7 and further allowed to extend in parallel to the X axis in the range from the positions x7 to x2, as shown in FIG. 11B. When the first electrode 60 includes inclined portions as described above, the number of first electrodes 60 connected to the electrode pads 70a and 70b can be effectively increased, whereby an increase in the current density in the portions where the first electrode is connected to the electrode pads can be suppressed.

When the semiconductor light emitting device 1 according to the first embodiment shown in FIGS. 1A and 6A and the semiconductor light emitting device 1c according to the variation shown in FIG. 11A are configured at the same dimensions, the maximum current density in the first electrode 60 of the semiconductor light emitting device 1c is 480 kA/cm², and the generated heat density is 116 W/cm². When compared with the light emission area of the semiconductor light emitting device 100 according to Comparative Example, the area of the light emitting layer of the semiconductor light emitting device 1c according to the variation is smaller only by 2.5%. The semiconductor light emitting device 1d shown in FIG. 11B achieves further improvement in the maximum current density and the generated heat density in the first electrode 60, 440 kA/cm² and 97.6 W/cm², respectively. The area of the light emitting layer decreases also only by 1.5%.

Variation 5 of First Embodiment

The width of the first electrode 60 can be arbitrarily set in accordance with the current density.

Figure 12A:
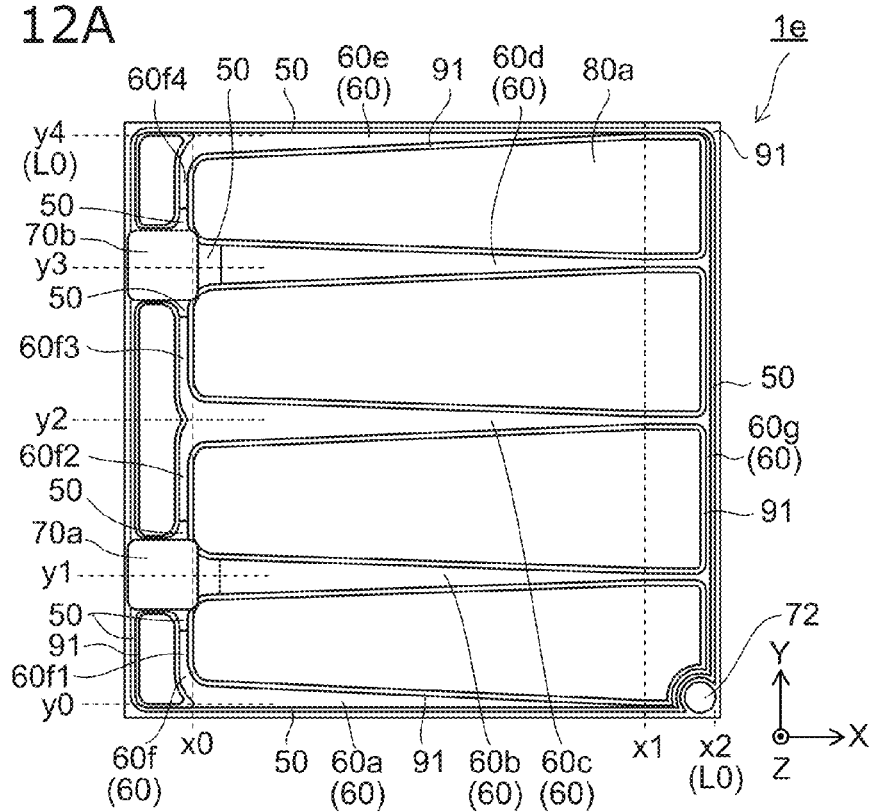
FIG. 12A is a perspective plan view showing example of a semiconductor light emitting device according to Variation 5 of the first embodiment.
Figure 12B:
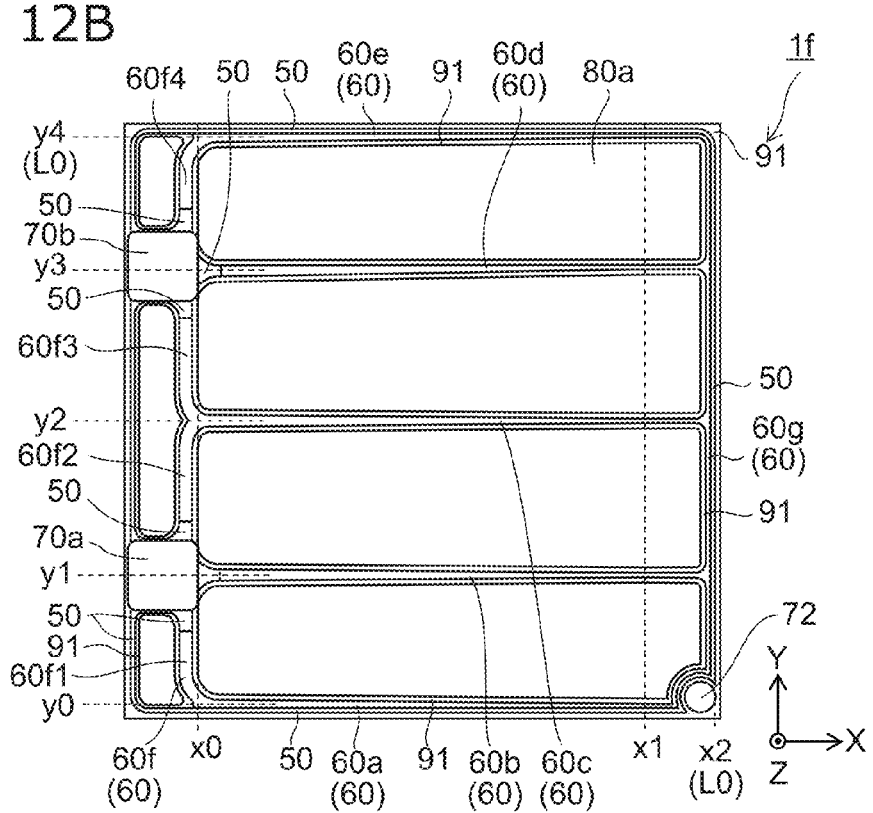
FIG. 12B is a perspective plan view showing example of a semiconductor light emitting device according to Variation 5 of the first embodiment.

FIGS. 12A and 12B are perspective plan views showing examples of a semiconductor light emitting device according to Variation 5 of the first embodiment.

In a semiconductor light emitting device 1e according to the variation, the first electrode 60 at the portions where it is connected to the electrode pads 70a and 70b is set to be wide, as shown in FIG. 12A. More specifically, the width wa is set at 100 μm, which is twice the width of the first electrode 60 of the semiconductor light emitting device 1 according to the first embodiment. The width is minimized in the position x1, where the width wb is 10 μm, which is the same as the width wb in the semiconductor light emitting device 1 according to the first embodiment. In this case, the maximum current density in the first electrode 60 is 400 kA/cm², which allows use of Al as the electrode material.

In a semiconductor light emitting device 1f according to the variation, the first electrode 60 at the portions where it is connected to the electrode pads 70a and 70b is set to be narrow, as shown in FIG. 12A. The width is set at 30 μm, which is smaller the width wa of the first electrode of the semiconductor light emitting device 1 according to the first embodiment. The width wb of the narrowest portion is 10 μm. In this case, the maximum current density in the first electrode 60 is 600 kA/cm².

The width of the first electrode 60 can be arbitrarily set in accordance with the value of employed drive current and current density, as in the semiconductor light emitting devices 1e and 1f according to the variations described above.

Variation 6 of First Embodiment

In the first embodiment and the variations thereof described above, the number of first electrodes 60a to 60e, which form the horizontal lines, is all set at five. The number of first electrodes can be arbitrarily set in accordance with the value of drive current and the current density.

Figure 13A:
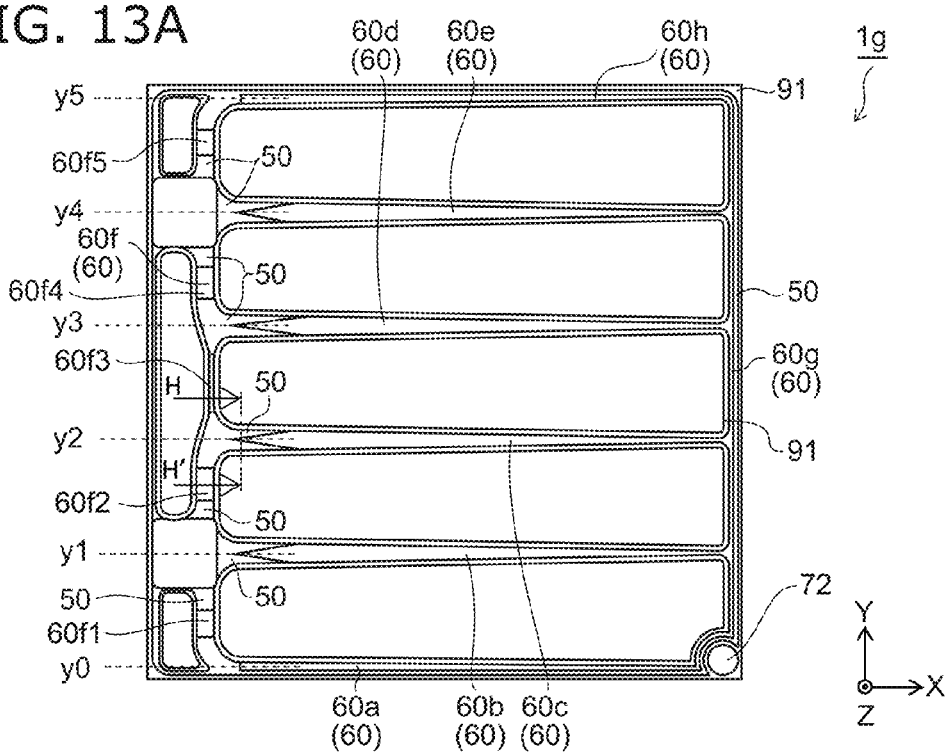
FIG. 13A is a perspective plan view illustrating a semiconductor light emitting device according to Variation 6 of the first embodiment.
Figure 13B:
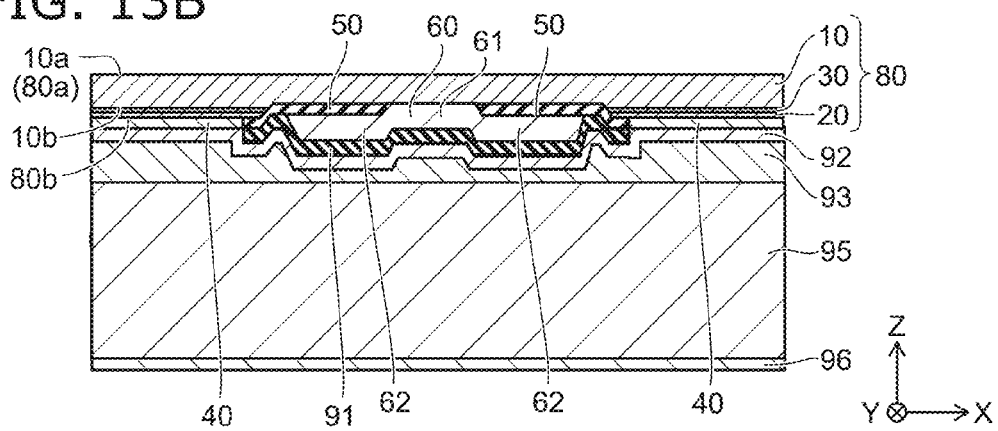
FIG. 13B is a cross-sectional view taken along the line H-H' in FIG. 13A.
Figure 13C:
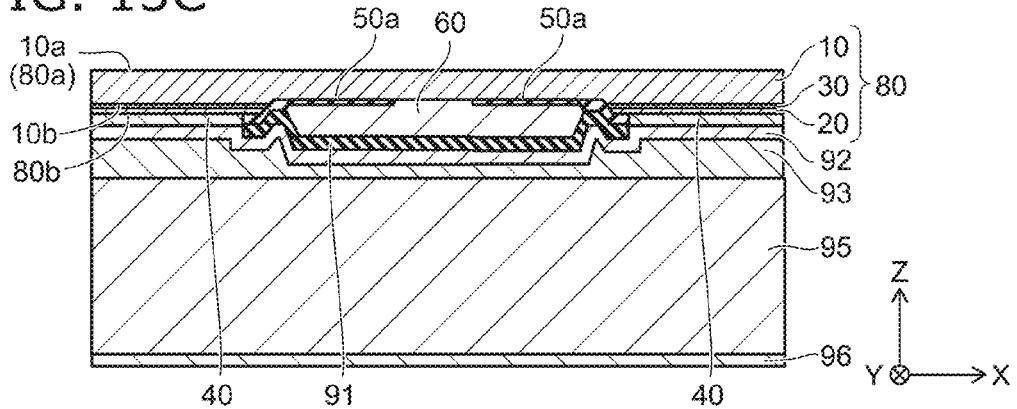
FIG. 13C is a cross-sectional view taken along the line H-H' in FIG. 13A.

FIG. 13A is a perspective plan view illustrating a semiconductor light emitting device according to Variation 6 of the first embodiment. FIGS. 13B and 13C are cross-sectional views taken along the line H-H' in FIG. 13A.

Figure 14A:
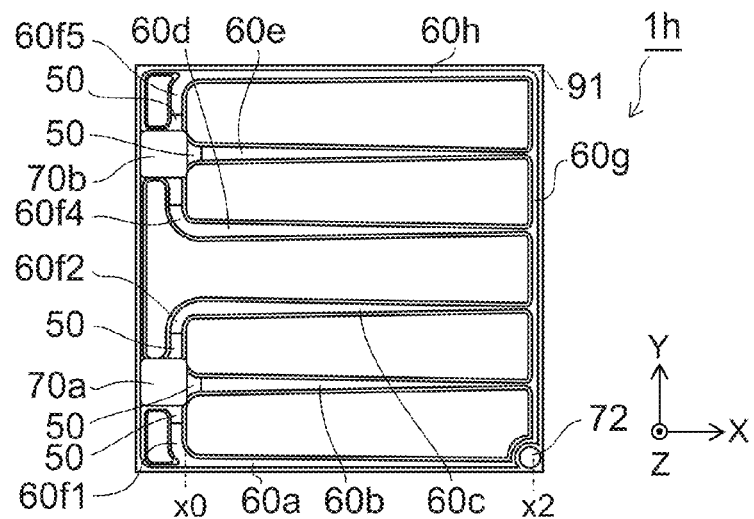
FIG. 14A is a perspective plan view showing other example of the semiconductor light emitting device according to the variation.
Figure 14B:
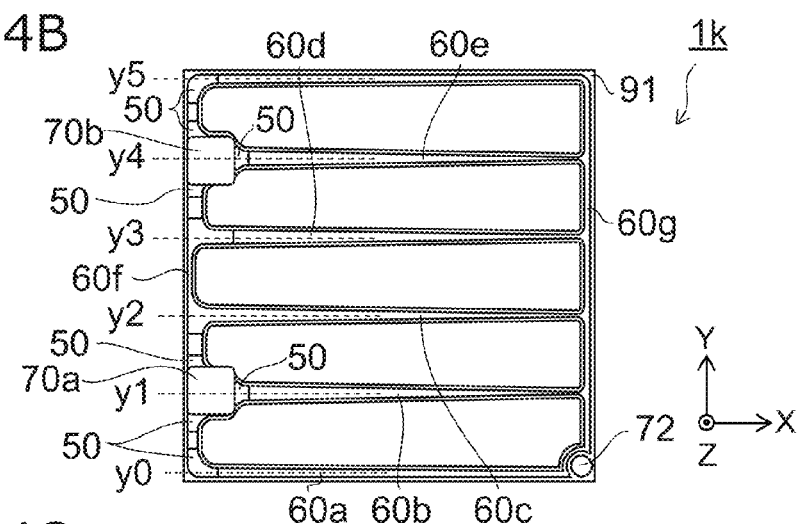
FIG. 14B is a perspective plan view showing other example of the semiconductor light emitting device according to the variation.
Figure 14C:
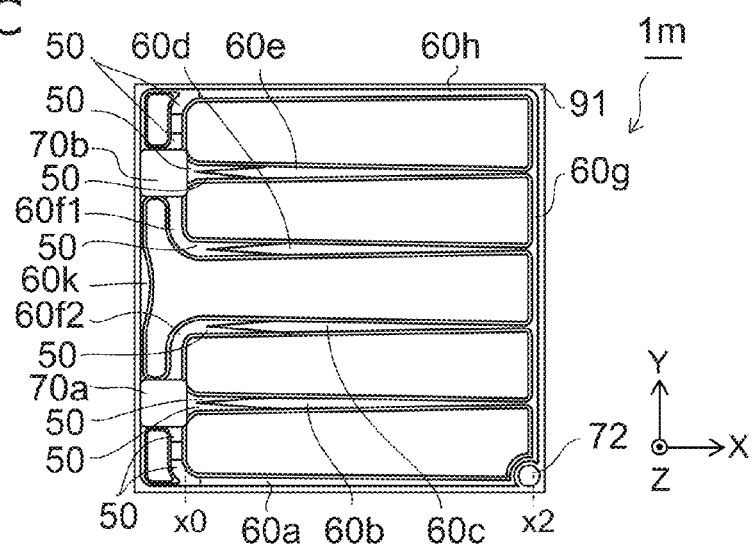
FIG. 14C is a perspective plan view showing other example of the semiconductor light emitting device according to the variation.

FIGS. 14A to 14C are perspective plan views showing other examples of the semiconductor light emitting device according to the variation.

FIGS. 15A to 15D are graphs showing the current density distribution in the semiconductor light emitting devices according to the variation.

A semiconductor light emitting device 1g according to Variation 5 has six first electrodes 60a to 60e and 60h, which form the horizontal lines, as shown in FIG. 13A. The first electrodes 60a to 60e and 60h are arranged in parallel to the X axis and at equal intervals in the Y-axis-direction. The first electrodes 60a to 60e and 60h are located in Y-coordinate positions y0, y1, y2, y3, y4, and y5, and the following relationships are satisfied: y1−y0=y2−y1=y3−y2=y4−y3=y5−y4. The first electrode 60a is disposed along the lowermost side in the Y-axis-direction, and the first electrode 60h is disposed along the uppermost side in the Y-axis-direction. The first electrodes 60f and 60g, which form the vertical lines, are disposed in parallel to the Y axis. The opposite ends of the first electrodes 60f and 60g are connected to the opposite ends of the first electrodes 60a and 60h. The first electrode 60f, which forms one of the vertical lines, is divided into five portions. A first electrode 60/1 has one end connected to the electrode pad 70a and the other end connected to one end of the first electrode 60a. A first electrode 60/2 has one end connected to the electrode pad 70a and the other end connected to one end of the first electrode 60c and to one end of a first electrode 60/3. The other end of the first electrode 60/3 is connected to one end of the first electrode 60d and to one end of a first electrode 60/4. The other end of the first electrode 60/4 is connected to the electrode pad 70b. A first electrode 60/5 has one end connected to the electrode pad 70b and the other end connected to one end of the first electrode 60h.

The semiconductor light emitting device 1g according to the variation includes the current block layer 50. The current block layer 50 is provided in the vicinity of the positions where the first electrode 60 is connected to the electrode pads 70a and 70b, portions where the first electrode 60 bends, and an outer circumferential portion. As shown in FIG. 13A, the current block layer 50 in the vicinity of the electrode pads 70a and 70b and the bent portions close to the electrode pads 70a and 70b, where the current density tends to increase, is inclined to the direction in which current conducts as shown in FIG. 8A. The location and shape of the current block layer 50 can be arbitrarily set in accordance with the current density distribution and other factors, as described above. Further, in the cross-sectional structure of the first electrode 60, the first portion 61, where no current block layer 50 is formed, and the second portion 62, where the current block layer 50 is formed, produce a step in the Z-axis-direction, as shown in FIG. 13B. The step scatters the electron current so that current concentration is suppressed in the location where the current block layer 50 is formed, whereby resistance against electromigration can be improved, as in the semiconductor light emitting device 1 according to the first embodiment. The current block layer 50a shown in FIG. 13C, which a high resistance layer formed of an inactive layer in place of the dielectric layer, also allows improvement in resistance against electromigration in the portion where the current block layer 50a is formed, as in the semiconductor light emitting device 1 according to the first embodiment.

In the semiconductor light emitting device 1g, the first electrodes 60a to 60c, 60/1, and 60/2 and the first electrodes 60d, 60e, 60h, 60/4, and 60/5 are configured to be symmetric with respect to center lines containing y1 and y4 and parallel to the X axis, respectively. The first electrodes 60 described above are further configured to be symmetric with respect to a center line containing (y3+y2)/2 and parallel to the X axis. It is therefore believed that current hardly flows through the first electrode 60/3, which connects the first electrodes 60a to 60c, 60/1, and 60/2 to the first electrodes 60d, 60e, 60h, 60/4, and 60/5. In view of the assumption described above, a semiconductor light emitting device 1h may have a first electrode pattern in which the first electrode 60/3 is omitted, as shown in FIG. 14A. In the semiconductor light emitting device 1h, the light emission area increases at least by a value corresponding to the removed first electrode 60/3, whereby the light emission efficiency is improved.

A conductive layer called a current dispersion layer is formed along the outer circumference of any of the semiconductor light emitting devices described above, and the conductive layer is typically connected nowhere including the electrode pads 70a and 70b. The conductive layer may be shared by the first electrode 60a along the lowermost side, the first electrode 60h along the uppermost side, and the first electrodes 60f and 60g, which form the vertical lines, so that the first electrode 60 surrounds the entire light emitting surface, as shown in FIG. 14B. A thus configured semiconductor light emitting device 1k allows improvement in the light emission efficiency.

In a semiconductor light emitting device 1m shown in FIG. 14C, in which a first electrode 60k in a portion where the light emission efficiency of the light emitting region decreases because the portion is located at the outer circumference is widened and the current is allowed to flow through the widened first electrode 60k, the light emission efficiency can be improved.

Figure 15A:
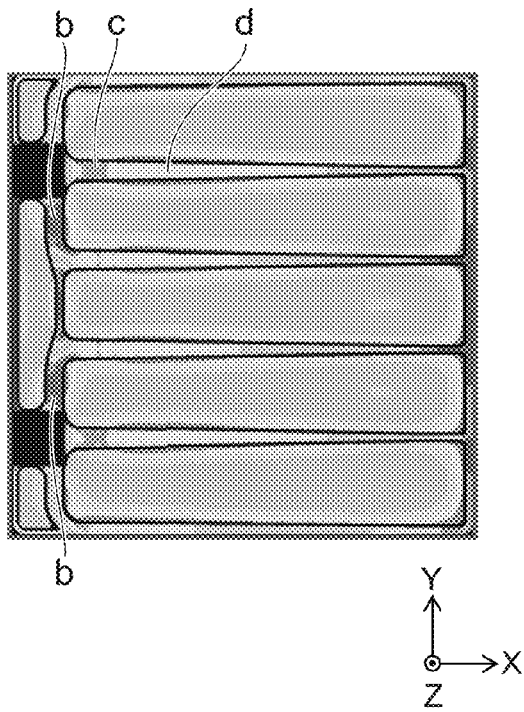
FIG. 15A is a graph showing the current density distribution in the semiconductor light emitting device according to the variation.

FIG. 15A is a graph showing the current density distribution in the semiconductor light emitting device 1g shown in FIG. 13A. As a result of increasing the number of horizontal lines, FIG. 15A shows that the area of the region b, where the current density is not more than 400 kA/cm$^2$, decreases. FIG. 15A further shows that the current density is low in the portion corresponding to the first electrode 60/3.

Figure 15B:
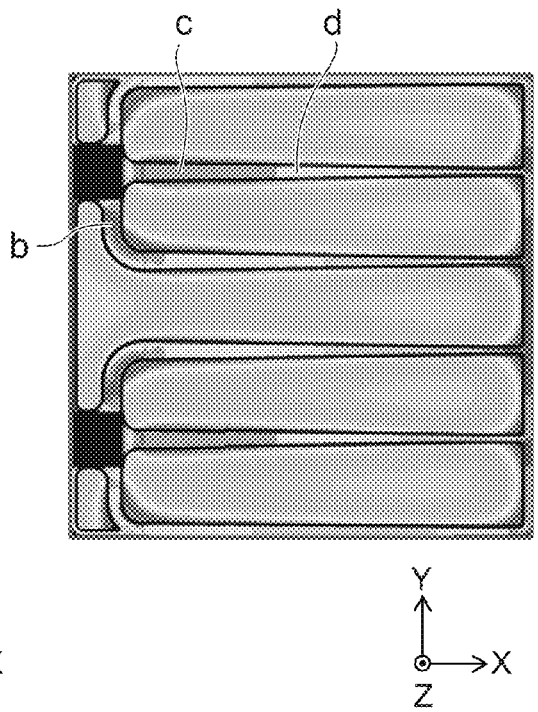
FIG. 15B is a graph showing the current density distribution in the semiconductor light emitting device according to the variation.

FIG. 15B is a graph showing the current density distribution in the semiconductor light emitting device 1h shown in FIG. 14A. FIG. 15B shows that removal of the first electrode 60/3 results in a decrease in the amount of light emission in an end portion in the X-axis-direction between the electrode pads 70a and 70b.

Figure 15C:
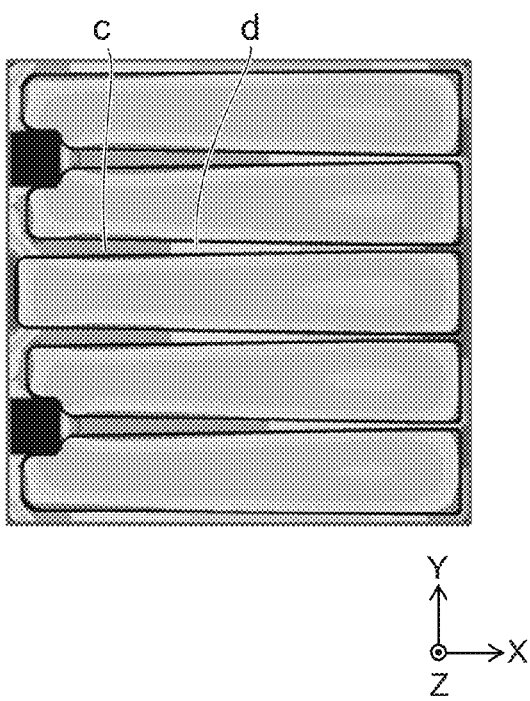
FIG. 15C is a graph showing the current density distribution in the semiconductor light emitting device according to the variation.

FIG. 15C is a graph showing the current density distribution in the semiconductor light emitting device 1k shown in FIG. 14B. FIG. 15C shows that the entire first electrode 60 forms the region c, where the current density is 200 kA/cm$^2$, and the light emission is also homogenized.

Figure 15D:
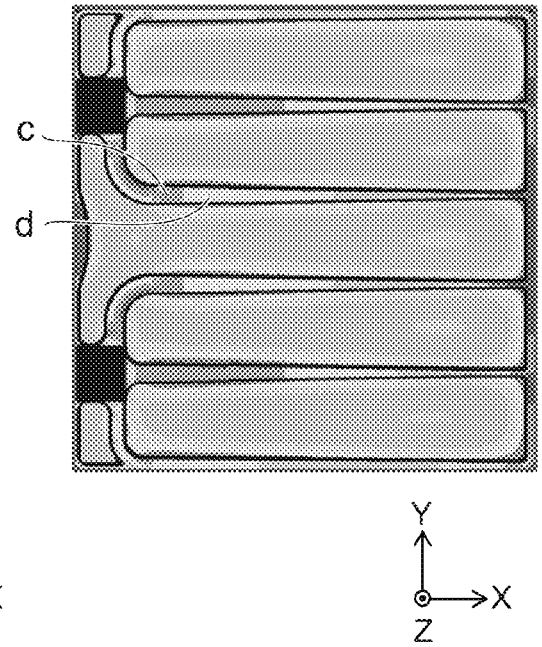
FIG. 15D is a graph showing the current density distribution in the semiconductor light emitting device according to the variation.

FIG. 15D is a graph showing the current density distribution in the semiconductor light emitting device 1m shown in FIG. 14C. FIG. 15D shows that the portion where the amount of light emission decreases in the semiconductor light emitting device 1h shows improved light emission.

As described above, the semiconductor light emitting devices according to the embodiment and the variations thereof allow suppression of unevenness of the current density distribution and hence homogenization of the amount of light emission in accordance with employed drive current and current density distribution. In the embodiment and the variations thereof, the description has been made of the case where the invention is applied to a lateral electrode structure in which the first electrode 60 is formed on the side of the first semiconductor layer 10 where the light emitting layer 30 is formed and the current between the first electrode 60 and the second electrode 40 flows laterally. In the lateral electrode structure, to lower the current density and hence to lower the generated heat density, it is difficult in some cases to increase the thickness of the first electrode for improvement in resistance against electromigration, and in such cases, the embodiment and the variations thereof are effective.

A description will be made of an example of a method for manufacturing primarily the semiconductor light emitting device 1 according to the first embodiment. The method can also be applied to the semiconductor light emitting devices according to the variations and other embodiments described later.

The first semiconductor layer 10 containing a nitride semiconductor, the light emitting layer 30, and the second semiconductor layer 20 are sequentially grown on a growth substrate in a crystal growth process to form the semiconductor layer 80. The growth substrate is made, for example, of Si. A metal film is deposited in vacuum evaporation or sputtering. A resist mask or any other component is used to pattern the metal film into a predetermined shape to form the second electrode 40.

A resist is applied onto the second semiconductor layer 20, which is then patterned, for example, in photolithography to provide an opening in the semiconductor layer 80. The second semiconductor layer 20, the light emitting layer 30, and part of the first semiconductor layer 10 is then etched in reactive ion etching (RIE). Part of the first semiconductor layer 10 is thus exposed.

An insulating film is deposited in the opening in plasma CVD (chemical vapor deposition) or sputtering. A resist mask or any other component is used to pattern the insulating film into a predetermined shape to form part of the current block layer 50 and the insulating layer 91. The deposition of the insulating film is desirably performed, for example, at a temperature not more than 300° C. for suppression of degradation in reflectance of the second electrode 40 and degradation in contact resistance.

The first electrode 60 is formed by using a lift-off method in such a way that the first electrode 60 covers the exposed first semiconductor layer 10, current block layer 50, and insulating layer 91. Part of the insulating layer 91 is so formed that it covers the first electrode 60. The insulating layer 91 is provided between the second electrode 40 and the first electrode 60. The back metal 92, the support layer 93, and other components are then stacked on the second electrode 40 and the insulating layer 91.

The growth substrate is removed by performing grinding and spin etching on the growth substrate for connection of the support substrate 95. Thereafter, the electrode pads 70a, 70b, and 72, which are electrically connected to the first electrode 60, are formed in the vicinity of the end of the semiconductor layer 80, and the backside contact 96 is formed on the rear surface of the support substrate 95. The semiconductor light emitting device 1 according to the embodiment can thus be manufactured by using known technologies.

Second Embodiment

The above description has been made of the case where the invention is applied to the lateral electrode structure, and the invention is also applicable to a semiconductor light emitting device having a vertical electrode structure.

Figure 16A:
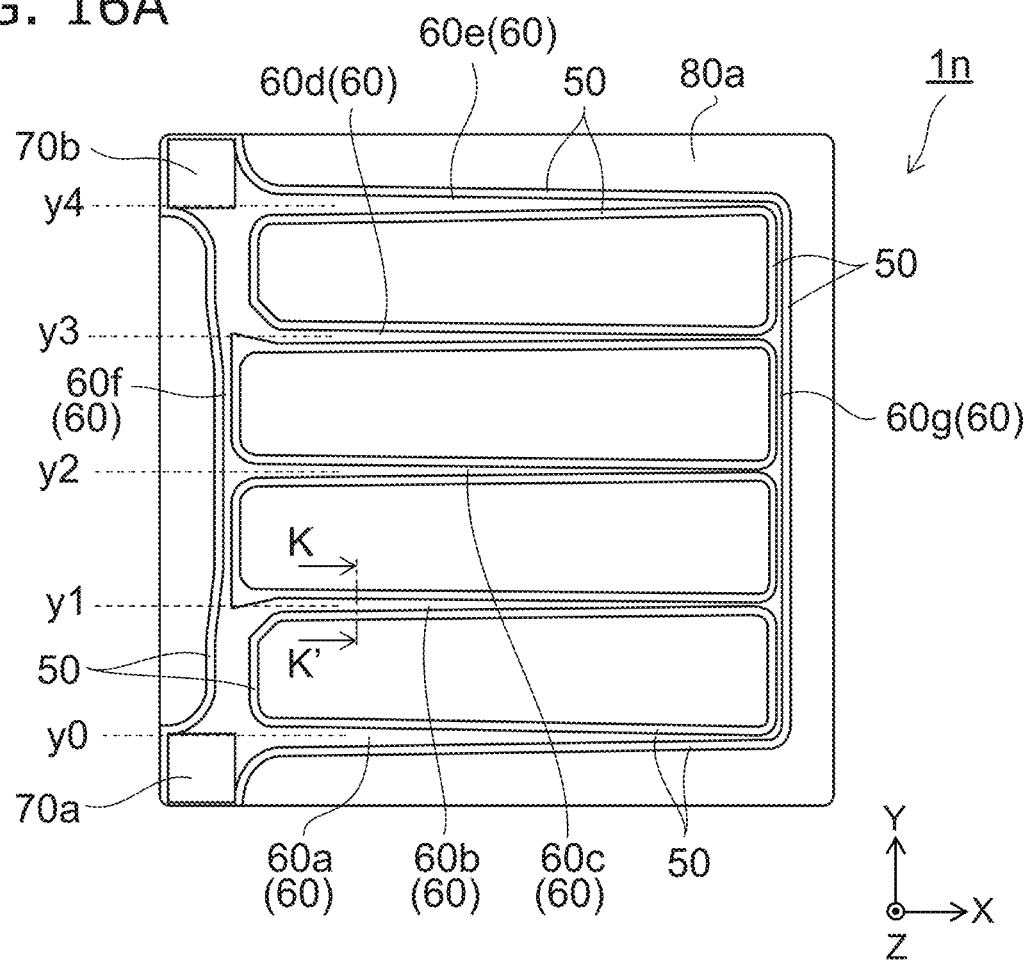
FIG. 16A is a perspective plan view illustrating a semiconductor light emitting device according to a second embodiment.
Figure 16B:
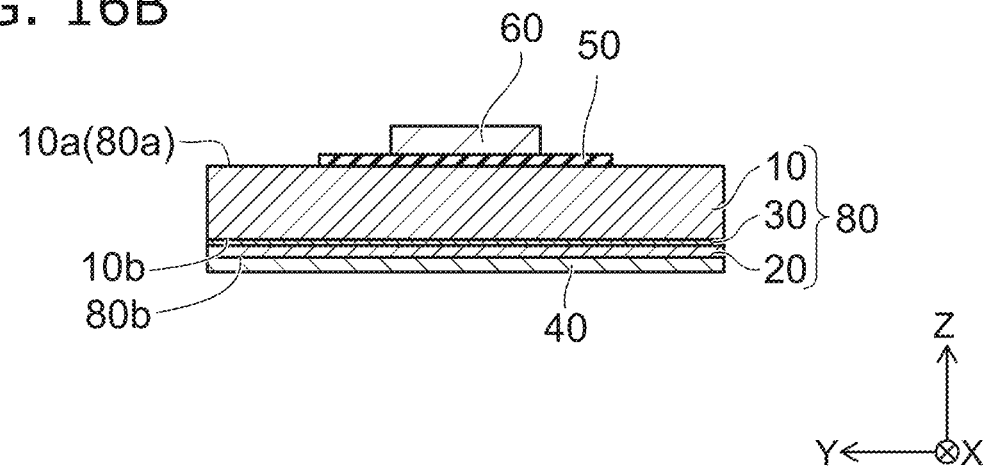
FIG. 16B is a cross-sectional view taken along the line K-K' in FIG. 16A.

FIG. 16A is a perspective plan view illustrating a semiconductor light emitting device according to a second embodiment. FIG. 16B is a cross-sectional view taken along the line K-K' in FIG. 16A.

Figure 17:
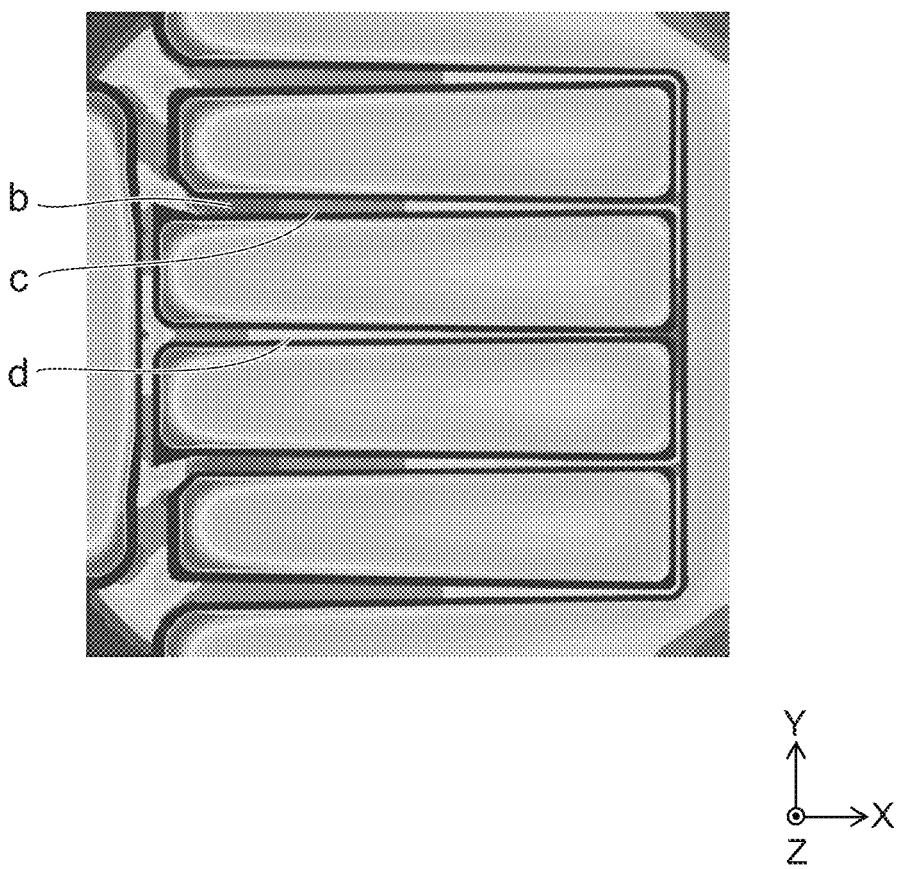
FIG. 17 is a graph showing the current density distribution in the semiconductor light emitting device according to the second embodiment.

FIG. 17 is a graph showing the current density distribution in the semiconductor light emitting device according to the second embodiment.

A semiconductor light emitting device in according to the embodiment includes a first semiconductor layer 10, a second semiconductor layer 20, a light emitting layer 30, a first electrode 60, a second electrode 40, a current block layer 50, and electrode pads 70a and 70b, as shown in FIGS. 16A and 16B. The first electrode 60 is provided on a surface 80a of the first semiconductor layer 10 that faces away from the surface on which the light emitting layer 30 is formed. The second electrode 40 is formed on another surface 80b of a semiconductor layer 80, that is, the surface of the second semiconductor layer 20 that faces away from the surface on which the light emitting layer 30 is formed. The current block layer 50 is provided between the first semiconductor layer 10 and the first electrode 60. In the semiconductor light emitting device in according to the embodiment, the second electrode 40, the second semiconductor layer 20, the light emitting layer 30, the first semiconductor layer 10, the current block layer 50, and the first electrode 60 are stacked in this order in the Z-direction.

Also in the semiconductor light emitting device in according to the embodiment, the shape and arrangement of the first electrode 60 can be arbitrarily set in accordance with the value of conducting drive current and the current density. Further, the shape of the current block layer 50 and the location where the current block layer 50 is disposed can also be arbitrarily set. In the example shown in FIG. 16A, the shape of the first electrode 60 in the XY plane is substantially the same as the pattern of the first electrode 60 shown in FIG. 11A. In the example shown in FIG. 16A, the current block layer 50 is so set that it surrounds the entire first electrode 60.

The first electrode 60 has no portion where the current density exceeds 400 kA/cm² (region b), and the amount of light emission is homogenized, as shown in FIG. 17.

Variations of Second Embodiment

Figure 18A:
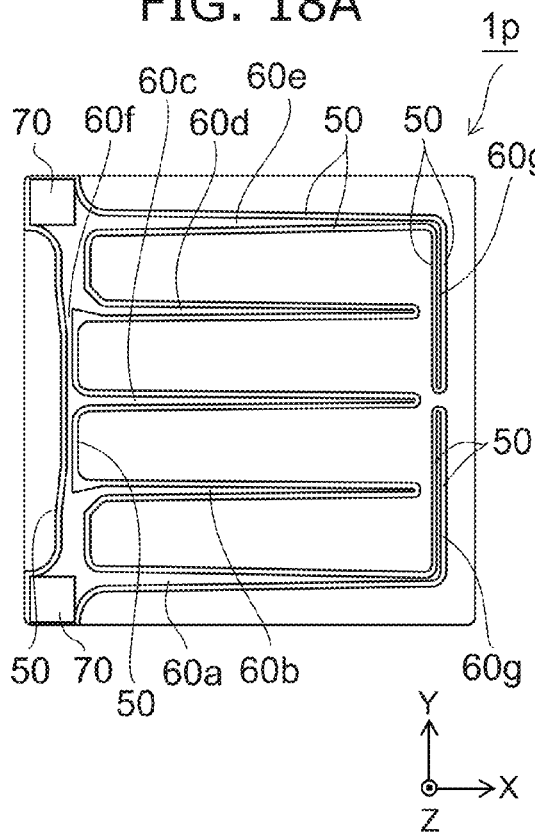
FIG. 18A is a perspective plan view showing semiconductor light emitting device according to variation of the second embodiment.
Figure 18B:
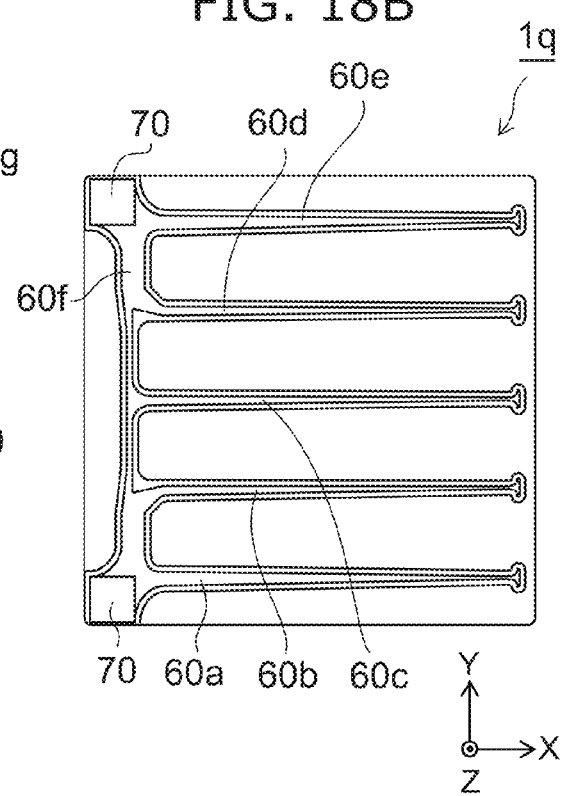
FIG. 18B is a perspective plan view showing semiconductor light emitting device according to variation of the second embodiment.
Figure 18C:
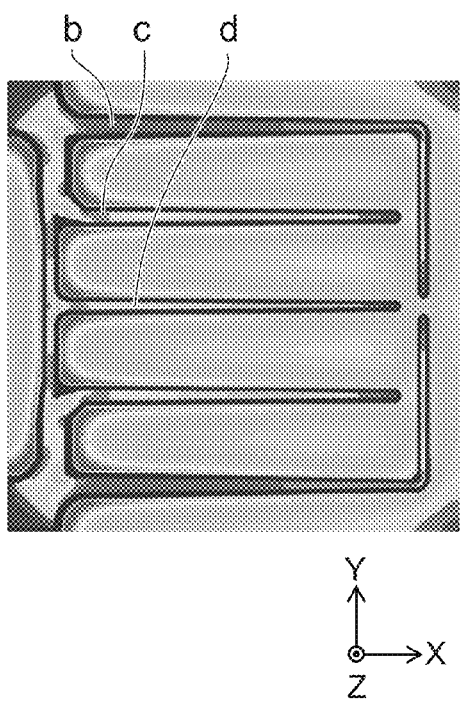
FIG. 18C is a graph showing the current density distribution in the semiconductor light emitting device according to the variation of the second embodiment.
Figure 18D:
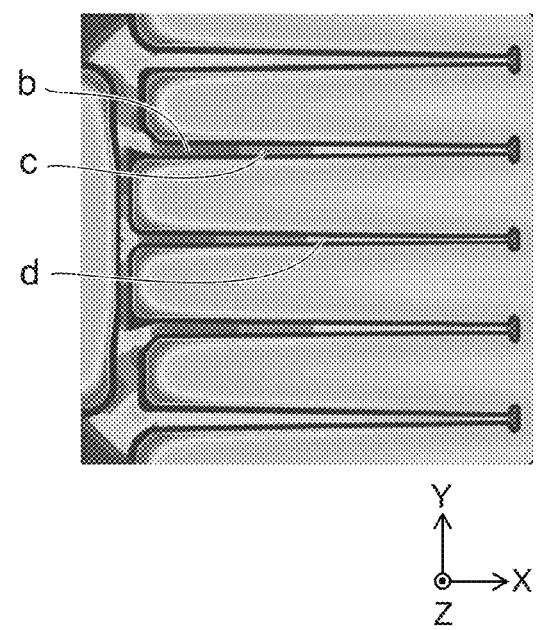
FIG. 18D is a graph showing the current density distribution in the semiconductor light emitting device according to the variation of the second embodiment.

FIGS. 18A and 18B are perspective plan views showing semiconductor light emitting devices according to variations of the second embodiment. FIGS. 18C and 18D are graphs showing the current density distribution in the semiconductor light emitting devices according to the variations of the second embodiment. FIG. 18C corresponds to FIG. 18A, and FIG. 18D corresponds to FIG. 18B.

In the semiconductor light emitting device in according to the embodiment, the shape and arrangement of the first electrode 60 can be arbitrarily set. In a semiconductor light emitting device 1p, a first electrode 60g, which forms a vertical line, may be separated to upper and lower portion and may also be separated from first electrodes 60b, 60c, and 60d, which form horizontal lines, as shown in FIG. 18A. In a semiconductor light emitting device 1q, the first electrode 60g, which forms a vertical line, may be omitted, and the first electrodes 60a to 60e, which form horizontal lines, may each have a wide front end portion, as shown in FIG. 18B.

According to the variations, the first electrode 60 can be configured to have no current density higher than 400 kA/cm², and the amount of light emission can be homogenized, as shown in FIGS. 18C and 18D.

Also in the semiconductor light emitting devices according to the embodiment and the variation thereof, the shape of the first electrode 60, such as the width of the first electrode 60, the number of first electrodes 60, the position where the current block layer 50 is formed, the shape of the current block layer 50, and other factors can be arbitrarily set in accordance with the current density distribution and other factors, as in the semiconductor light emitting device according to the first embodiment.

Third Embodiment

As described above, irrespective of the electrode structure, vertical or lateral, the shape of the first electrode 60 and the shape and arrangement of the current block layer 50 can be so applied that the current density distribution and the amount of light emission are homogenized for suppression of degradation in reliability, such as electromigration due to current concentration. This approach is also applicable to a semiconductor light emitting device having a flip-chip structure in which both electrodes are disposed on one side.

Figure 19:
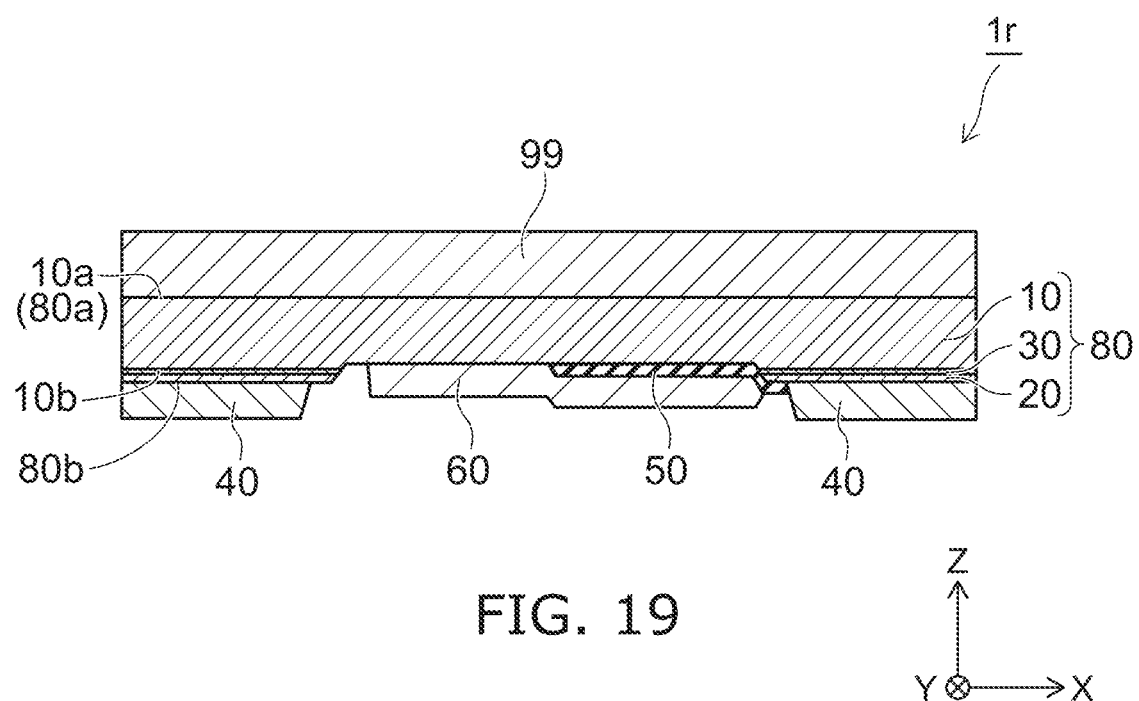
FIG. 19 is a cross-sectional view illustrating a key portion of a semiconductor light emitting device according to a third embodiment.

FIG. 19 is a cross-sectional view illustrating a key portion of a semiconductor light emitting device according to a third embodiment.

A semiconductor light emitting device 1r according to the embodiment includes a first semiconductor layer 10, a second semiconductor layer 20, a light emitting layer 30, a first electrode 60, a second electrode 40, a current block layer 50, and an electrode pad 70 (not shown), as shown in FIG. 19. The semiconductor light emitting device 1r differs from the semiconductor light emitting devices according to the first and second embodiments and other semiconductor light emitting devices in that a substrate 99 is provided on a surface 80a of a semiconductor layer 80 and no support layer 93 or no insulating layer 91 is provided. The cross-sectional view of FIG. 19 corresponds to the cross-sectional view of FIG. 1B, and the semiconductor light emitting device 1r is substantially the same as the semiconductor light emitting device 1 shown in FIG. 1A except that a substrate 99 is provided on the semiconductor layer 80 and the support layer 93 or the insulating layer 91 is not provided and will not therefore be described in detail.

Even in the semiconductor light emitting device 1r having the flip-chip electrode structure, the reliability can be improved by configuring the first electrode 60 to have a widened portion connected to the electrode pad 70 and setting the width of the first electrode 60 to decrease with distance from the electrode pad to increase the magnitude of conducting current and suppress an increase in the current density. Since the width of the first electrode 60 decreases with distance from the electrode pad, a decrease in the light emission area can be suppressed, but the light emission efficiency can be improved. Further, providing the current block layer 50 allows dispersion of the direction of the electron current at a location where the current density increases, contributing to homogenization of the current density. As a result, the light emission efficiency of the semiconductor light emitting device 1r can be improved with the reliability thereof maintained and improved.

In the specification, the term "nitride semiconductor" represents materials including a semiconductor having any composition expressed by a chemical formula $B_xIn_yAl_zGa_{1-x-y-z}N$ ($0 \leq x \leq 1$, $0 \leq y \leq 1$, $0 \leq z \leq 1$, $x+y+z \leq 1$) in which the composition ratio among x, y, and z is changed within the ranges. Further, semiconductors expressed by the chemical formula described above but further containing any of the following substances also fall within the "nitride semiconductor": a V-group element other than N (nitrogen); a variety of elements added to control a variety of physical properties, such as the conductivity; and a variety of elements that are unintendedly contained.

In the specification, the terms "perpendicular" and "parallel" are not limited to exactly perpendicular or exactly parallel, also permit, for example, variations in manufacturing processes, and only need to be substantially perpendicular and substantially parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a semiconductor layer including a first semiconductor layer having a first conductivity type, a second semiconductor layer having a second conductivity type, and a light emitting layer provided between the first semiconductor layer and the second semiconductor layer;
   an electrode pad provided in adjacent to the semiconductor layer;
   a first electrode connected to the electrode pad with one end, extending from the electrode pad, and being connected on one surface of the first semiconductor layer;
   a second electrode connected to the second semiconductor layer;
   a layer provided between part of the first semiconductor layer and part of the first electrode and having conductivity less than conductivity of the first electrode;
   a first insulating layer provided between the first electrode and the second electrode;
   the first electrode having an electrode width, the electrode width being a length along a surface that the first electrode connects to the first semiconductor layer, the length being in a direction perpendicular to a direction in which the first electrode extends, the electrode width decreasing with distance from the electrode pad,
   the first electrode being in contact with a first surface of the first semiconductor layer, the first surface being a surface on a side where the light emitting layer is provided,
   the layer being contact with the first surface and extending from an edge of the electrode pad along the direction in which the first electrode extends,
   the first electrode including a first portion that is contact with the first surface and provided in adjacent to the layer, and a second portion that is contact with the layer at a side facing away from a surface of the layer that is contact with the first surface, the second portion extending from the edge of the electrode pad along the direction in which the first electrode extends,
   a substrate having conductivity; and
   a conductive layer provided between the second electrode and the substrate, and provided on the first portion and the second portion through the first insulating layer, the conductive layer being in contact with a surface of the second electrode and electrically connecting to the second electrode and the substrate.

2. The device according to claim 1,
   wherein from another end of the first electrode, to positions between the one end and the another end, the electrode width is fixed.

3. The device according to claim 2,
   wherein the layer is so provided that the layer extends from a position where the first electrode is connected to the electrode pad along the direction in which the first electrode extends.

4. The device according to claim 3,
   wherein the layer has a width that is a length in the direction perpendicular to the extending direction, and the width varies along the direction in which the layer extends.

5. The device according to claim 4,
   wherein the layer includes a portion making an angle different from the direction in which the first electrode extends.

6. The device according to claim 1,
   wherein the layer is a second insulating layer.

7. The device according to claim 6,
   wherein the second insulating layer includes a dielectric layer.

8. The device according to claim 6,
   wherein the second insulating layer includes an inactive layer that is a high resistivity layer formed by partially inactivating a surface of the first semiconductor that is contact with the first electrode.

9. The device according to claim 1,
   wherein the conductive layer includes metal which suppress metal atoms configured the second electrode to diffuse.

10. The device according to claim 1,
    wherein the conductive layer includes material which reflects a light emitted from the light emitting layer.

11. The device according to claim 1,
    wherein the conductive layer includes a solder.

12. The device according to claim 1,
    wherein the conductive layer includes a bonded layer.

* * * * *